(12) United States Patent
Canning

(10) Patent No.: US 7,720,651 B2
(45) Date of Patent: May 18, 2010

(54) COMPRESSION OF INTERACTION DATA USING DIRECTIONAL SOURCES AND/OR TESTERS

(76) Inventor: Francis X. Canning, 59 Delrose Dr., Morgantown, WV (US) 26508

( * ) Notice: Subject to any disclaimer, the term of this patent is extended or adjusted under 35 U.S.C. 154(b) by 1101 days.

(21) Appl. No.: 10/354,241

(22) Filed: Jan. 29, 2003

(65) Prior Publication Data

US 2004/0010400 A1    Jan. 15, 2004

Related U.S. Application Data

(63) Continuation-in-part of application No. 09/676,727, filed on Sep. 29, 2000.

(60) Provisional application No. 60/355,492, filed on Feb. 7, 2002.

(51) Int. Cl.
*G06F 17/10* (2006.01)
(52) U.S. Cl. ............................. 703/2; 703/13
(58) Field of Classification Search ........... 703/2, 703/5, 13
See application file for complete search history.

(56) References Cited

U.S. PATENT DOCUMENTS

| | | | |
|---|---|---|---|
| 5,548,798 A | 8/1996 | King | |
| 5,615,288 A | 3/1997 | Koshi et al. | |
| 5,867,416 A | 2/1999 | Feldmann et al. | |
| 6,051,027 A | 4/2000 | Kapur et al. | |
| 6,064,808 A | 5/2000 | Kapur et al. | |
| 6,182,270 B1 | 1/2001 | Feldmann et al. | |
| 6,353,801 B1 * | 3/2002 | Sercu et al. | 702/65 |
| 6,363,338 B1 | 3/2002 | Ubale et al. | |
| 6,675,137 B1 | 1/2004 | Toprac et al. | |
| 2004/0078174 A1 | 4/2004 | Canning | |
| 2006/0195306 A1 | 8/2006 | Canning | |
| 2006/0265200 A1 | 11/2006 | Canning | |
| 2008/0046225 A1 | 2/2008 | Canning | |
| 2008/0065361 A1 | 3/2008 | Canning | |
| 2008/0091391 A1 | 4/2008 | Canning | |
| 2008/0091392 A1 | 4/2008 | Canning | |
| 2008/0097730 A1 | 4/2008 | Canning | |

OTHER PUBLICATIONS

Canning, "Impedance Matrix Localization Produces a Sparse Moment Method Matrix", IEEE Antennas and Propagation Society International Symposium, 1990. AP-S. 'Merging Technologies for the 90's'. Digest, May 1990, pp. 60-63.*

(Continued)

*Primary Examiner*—Kamini S Shah
*Assistant Examiner*—Herng-Der Day
(74) *Attorney, Agent, or Firm*—Knobbe, Martens, Olson & Bear, LLP

(57) ABSTRACT

A compression technique compresses interaction data. The interaction data can include a matrix of interaction data used in solving an integral equation. For example, such a matrix of interaction data occurs in the moment method for solving problems in electromagnetics. The interaction data describes the interaction between a source and a tester. In one embodiment, directional sources and/or directional testers are described. The directional sources produce a very weak (or negligible) effect except in selected directional regions. The directional testers are relatively insensitive to an incoming effect except in selected directional regions. Depending on their locations and directional properties, relatively many of the directional sources and directional testers interact weakly (or negligibly). The weak interactions can be effectively removed from the interaction matrix, thereby reducing the effective size of the interaction matrix.

21 Claims, 22 Drawing Sheets

OTHER PUBLICATIONS

Bebendorf, "Approximation of Boundary Element Matrices", Numer. Math. 86, 2000, pp. 565-589.*

Kevin Amaratunga, "A Wavelet-Based Approach for Compressing Kernel Data in Large-Scale Simulations of 3D Integral Problems", Computing in Science & Engineering, Jul./Aug. 2000, pp. 35-45.

Soren Anderson, "On Optimal Dimension Reduction for Sensor Array Signal Processing", Signal Processing, Jan. 1993, pp. 245-256.

Boag, et al., "Complex Multiple Beam Approach to Electromagnetic Scattering Problems", IEEE Transactions on Antennas and Propagation, vol. 42, No. 3, Mar. 1994.

Borgiotti, et al., "The determination of the far field of an acoustic radiator from sparse measurement samples in the near field", Journal of the Acoustical Society of America, vol. 92, Aug. 1992, pp. 807-818.

Bomholdt, et al., "Mixed-Domain Galerkin Expansions in Scattering Problems", IEEE Transactions on Antennas and Propagation, vol. 36, No. 2, Feb. 1988, pp. 216-227.

Brandt, et al., "Multilevel Matrix Multiplication and Fast Solution of Integral Equations", Journal of Computational Physics, 1990, pp. 348-370.

Bucci, et al., "On the Degrees of Freedom of Scattered Fields", IEEE Transactions on Antennas and Propagation, vol. 37, No. 7, Jul. 1989, pp. 918-926.

Francis X. Canning, "The Impedance Matrix Localization (IML) Method for Moment-Method Calculations", IEEE Antennas and Propagation Magazine, vol. 23, No. 5, Oct. 1990, pp. 18-30.

Francis X. Canning, "Reducing Moment Method Storage from Order $N^2$ to Order N", Electronics Letters, vol. 25, No. 19, Sep. 1989, pp. 1274-1275.

Francis X. Canning, "Solution of Impedance Matrix Localization Form of Moment Method Problems in Five Iterations", Radio Science, vol. 30, No. 5, Sep.-Oct. 1995, pp. 1371-1384.

Francis X. Canning, "Fast Sparse Decomposition of Standard Moment Matrices", 1997 North American Radio Science Meeting, Program and Abstracts, Jul. 1997, pp. 68-69.

Canning, et al., "Fast Direct Solution of Standard Moment-Method Matrices", IEEE Antennas & Propagation, vol. 40, No. 3, Jun. 1998, pp. 15-26.

Francis X. Canning, "Improved Impedance Matrix Localization Method", IEEE Transactions on Antennas and Propagation, vol. 41, No. 5, May 1993, pp. 659-667.

Francis X. Canning, "A Fast Moment Method Matrix Solver", $14^{th}$ Annual Review of Progress in Applied Computational Electromagnetics, Mar. 1998, pp. 449-454.

Coifman, et al., "The Fast Multipole Method for the Wave Equation: A Pedestrian Prescription", IEEE Antennas and Propagation Magazine, vol. 35, No. 3, Jun. 1993, pp. 7-12.

Deng, et al., "Fast Solution of Electromagnetic Integral Equations Using Adaptive Wavelet Packet Transform", IEEE Transactions of Antennas and Propagation, vol. 47, No. 4, Apr. 1999, pp. 674-682.

Gothard, et al., "A New Technique to Generate Sparse Matrix Using the Method of Moments—Application to Two-Dimensional Problems", Presented at the URSI Meeting, Jun. 1995, Newport Beach, California, p. 302 of the meeting digest.

Greengard, et al., "A Fast Algorithm for Particle Simulations", Journal of Computational Physics, vol. 73, No. 2, Dec. 1987, pp. 325-348.

Gabriel F. Hermann, "Note on Interpolational Basis Functions in the Method of Moments", IEEE Transactions on Antennas and Propagation, vol. 38, No. 1, Jan. 1990, pp. 134-137.

Kapur, et al., "Efficient Full-Wave Simulation in Layered, Lossy Media", Custom Integrated Circuits Conference, May 11-14, 1998.

Kapur, et al., "IES$^3$: A Fast Integral Equation for Efficient 3-Dimensional Extraction", International Conference on Computer-Aided Design, Nov. 9-13, 1997.

Kapur, et al., "Efficient Electrostatic and Electromagnetic Simulation Using IES$^3$", IEEE Journal on Comp. Eng., Dec. 1998.

Kapur, et al., "Efficient Three-Dimensional Extraction Based on Static and Full-Wave Layered Green's Functions", Design Automation Conference, Jun. 16, 1998.

Kapur, et al., "High-Order Nyström Schemes for Efficient 3-D Capacitance Extraction", International Conference on Computer-Aided Design, Nov. 8-12, 1998.

Kevorkian, et al, "Sparse Complete Orthogonal Factorization as Applied to Bistatic Target Strength Prediction", DOD High Performance Computing $7^{th}$ Users Group Conference, Jun. 26, 1997.

Liu, et al., "Scattering of 2-D Conducting Concave Object by MoM Matrix Decomposition Technique", Microwave and Optical Technology Letters, vol. 25, No. 2, Apr. 20, 2000, pp. 149-152.

Michielssen, et al., "Multilevel Evaluation of Electromagnetic Fields for the Rapid Solution of Scattering Problems", Microwave and Optical Technology Letters, vol. 7, No. 17, Dec. 1994, pp. 790-795.

Michielssen, et al., "A Multilevel Matrix Decomposition Algorithm for Analyzing Scattering from Large Structures", IEEE, vol. 44, No. 8, Aug. 1996, pp. 1086-1093.

Michielssen, et al., "Reduced Representation of Matrices Generated by the Method of Moments", IEEE, vol. 1, No. 94CH3466-0, Jun. 1994, pp. 419-423.

Douglas M. Photiadis, "The Relationship of Singular Value Decomposition to Wave-Vector Filtering in Sound Radiation Problems", J. Acoust. Soc. Am.88(2), Aug. 1990, pp. 1152-1159.

Ronald J. Pogorzelski, "Improved Computational Efficiency via Near-Field Localization", IEEE Transactions on Antennas and Propagation, vol. 41, No. 8, Aug. 1993, pp. 1081-1087.

Rao, et al., "A New Technique to Generate Sparse matrix using the Method of Moments—Wire Scattering Problems", Presented at the URSI Meeting, Jun. 1995, Newport Beach, California, p. 303 of the meeting digest.

Rao, et al., "Generation of Adaptive Basis Functions to Create a Sparse Impedance Matrix Using Method of Moments", Presented at the URSI Meeting, Jul. 20, 2000, Salt Lake City, Utah, p. 254 of the meeting digest.

Rao, et al, :A New Technique to Generate a Sparse Matrix Using the Method of Moments for Electromagnetic Scattering Problems, Microwave and Optical Technology Letters, vol. 19, No. 4, Nov. 1998.

Rius, et al., "The Multilevel Matrix Decomposition Algorithm in 3-D" Proceedings of the International Conference on Electromagnetics in Advanced Applications, Sep. 1999, pp. 728-732.

Rokhlin, et al., "Generalized Gaussian Quadratures and Singular Value Decompositions of Integral Operators", Research Report YALEU/DCS/RR-1109, May 1996.

Vladimir Rokhlin, "Sparse Diagonal Forms for Translation Operators for the Helmholtz Equation in Two Dimension", Research Report YALEU/DCS/RR-1095, Dec. 1995.

Vladimir Rokhlin, "Diagonal Forms of Translation Operators for the Helmholtz Equation in Three Dimensions", Research Report YALEU/DCS/44-894, Mar. 1992.

Schenck, et al., "A Hybrid Method for Predicting the Complete Scattering Function from Limited Data", J. Acoust. Am. 98(6), Dec. 1995, pp. 3469-3481.

Wagner, et al., "A Ray-Propagation Fast Multipole Algorithm", Microwave and Optical Technology Letters, vol. 7, No. 10, Jul. 1994, pp. 435-438.

Zientara, et al., "Dynamic Adaptive MR Imaging Using Multi-Resolution SVD Encoding Incorporating Optical Flow-Based Predictions", Report of National Academy of Sciences Committee on the "Mathematics and Physics of Emerging Dynamic Biomedical Imaging", Nov. 1993.

PCT International Search Report.

Keith Nabors and Jacob White, "FastCap: A Multipole Accelerated 3-D Capacitance Extraction Program," IEEE Transactions on Computer Aided Design, vol. 10, No. 11, Nov. 1991, pp. 1447-1459.

Hackbusch, Leipzig W., "A Sparse Matrix Arithmetic Based on H-Matrices. Part I: Introduction to H-Matrices," Computing 62, pp. 89-108, 1999.

Baharav, Zachi, "Impedance Matrix Compression (IMC) Using Iteratively Selected Wavelet Basis," IEEE Transactions on Antennas and Propagation, vol. 46, No. 2, Feb. 2, 1998, pp. 226-233.

Bunch, James R., "Partitioning, Tearing and Modification of Sparse Linear Systems," Journal of Mathematical Analysis and Applications 48, 1974, pp. 574-593.

Bunch, James R., "Block Methods for Solving Sparse Linear Systems," Sparse Matrix Computations, 1976, pp. 39-58.

Saad et al., "Bilutm: A Domain-Based Multilevel Block Ilut Preconditioner for General Sparse Matrices," Siam J. Matrix Anal. Appl., vol. 21, No. 1, 1999, pp. 279-299.

Yalamov et al., "On the Stability of a Partitioning Algorithm for Tridiagonal Systems," Siam J. Matrix Anal. Appl., vol. 20, No. 1, 1998, pp. 159-181.

George, Alan, "On Block Elimination for Sparse Linear Systems," Siam J. Numer Anal, vol. 11, No. 3, Jun. 1974, pp. 585-603.

Higham, Nicholas J., "Block LU Factorization," Accuracy and Stability of Numerical Algorithms, Siam, 1996, pp. 245-259.

Conroy et al., "Data-Parallel Sparse LU Factorization," Siam J. Sci. Comput., vol. 19, No. 2, Mar. 1998, pp. 584-604.

Bank, Randolph E., "Marching Algorithms and Block Gaussian Elimination," Sparse Matrix Computations, 1976, pp. 293-307.

Coifman et al., "Faster Single-Stage Multipole Method for the Wave Equation," Conference Proceedings; $10^{th}$ Annual Review of Progress in Applied Computational Electromagnetics; at the Doubletree Hotel & Convention Center, Monterey, CA, vol. 1, Mar. 21-26, 1994, pp. 19-24.

Canning, Francis X., "A Sparse Approximate Inverse to the IML Matrices Allows Solution in Five Iterations," 1992, IEEE, pp. 176-179.

Chew et al., "Fast Solution Methods in Electromagnetics," Mar. 1997, IEEE Transactions on Antennas and Propagation, vol. 45, No. 3, pp. 533-543.

Fourie et al., "A Fast Sparse Iterative Method (SIM) for Method of Moment," 1994; IEEE, pp. 1146-1149.

Nitch et al., "A Redesign of NEC2 Using Object-Oriented Paradigm," 1994, IEEE.

Nitch et al., "Investigating Three Methods for Improving the Performance of the SIM Algorithm," 1994; IEEE, pp. 1166-1168.

West et al., "On Iterative Approaches for Electromagnetic Rough-Surface Scattering Problems," Aug. 1999, IEEE Transactions on Antennas and Propagation, vol. 47, No. 8, pp. 1281-1288.

Mobile/Cellular Technology website, http://www.mobilecomms-technology.com/contractors/antennas/poynting/press2.html, Oct. 2003, 2 pages.

"SuperNEC: Getting Started," Version 1.53, Poynting Software (Pty) Ltd., Sep. 3, 2001, in 26 pages.

"SuperNEC: GUI Input User Reference Manual," Version 1.5, Poynting Software (Pty) Ltd., May 11, 2001, in 107 pages.

"SuperNEC: GUI Output User Reference Manual," Version 2.0, Poynting Software (Pty) Ltd., Dec. 3, 2001, in 48 pages.

"SuperNEC: GUI User Reference Manual," Version 1.00, Poynting Software (Pty) Ltd., Jul. 12, 2000, in 42 pages.

"SuperNEC: MOM Technical Reference Manual," Version 1.00, Poynting Software (Pty) Ltd., Jul. 14, 2000, in 62 pages.

"SuperNEC: MOM-UTD Hybrid User Reference Manual," Version 1.00, Poynting Software (Pty) Ltd., Jul. 14, 2000, in 67 pages.

"SuperNEC: Parallel MoM User Reference Manual," Version 1.00, Poynting Software (Pty) Ltd., Sep. 21, 1999, in 11 pages.

SuperNEC: Parallel MoM User Reference Manual, Version 2.0, Poynting Software (Pty) Ltd., Sep. 3, 2001, in 11 pages.

West et al., "On Iterative Approaches for Electromagnetic Rough-Surface Scattering Problems," Aug. 1999, IEEE Transactions on Antennas and Propagation, vol. 47, No. 8.

Kastner et al., "Multi-Region Reduced Field Testing (RFT) for Matrix Thinning," Third International Conference on Computation in Electromagnetics, Apr. 1996, pp. 312-317.

Office Action dated May 29, 2008 from Related U.S. Appl. No. 09/676,727.

Office Action dated Feb. 2, 2009 from Related U.S. Appl. No. 09/676,727.

Office Action dated Jun. 20, 2008 from Related U.S. Appl. No. 10/619,796.

Office Action dated Oct. 8, 2008 from Related U.S. Appl. No. 10/619,796.

Office Action dated Mar. 5, 2009 from Related U.S. Appl. No. 10/619,796.

Office Action dated May 22, 2009 from Related U.S. Appl. No. 10/619,796.

Office Action dated Jan. 3, 2008 from Related U.S. Appl. No. 11/417,429.

Office Action dated Jun. 18, 2008 from Related U.S. Appl. No. 11/417,429.

Office Action dated Sep. 29, 2008 from Related U.S. Appl. No. 11/417,429.

* cited by examiner

US 7,720,651 B2

COMPRESSION OF INTERACTION DATA USING DIRECTIONAL SOURCES AND/OR TESTERS

REFERENCE TO RELATED APPLICATIONS

The present application is a continuation-in-part of U.S. patent application Ser. No. 09/676,727, filed Sep. 29, 2000, titled "COMPRESSION AND COMPRESSED INVERSION OF INTERACTION DATA," the entire contents of which is hereby incorporated by reference. The present application also claims priority benefit of U.S. Provisional Application No. 60/355,492, filed Feb. 7, 2002, titled "COMPRESSION OF INTERACTION DATA USING DIRECTIONAL SOURCES AND/OR TESTERS,"

BACKGROUND OF THE INVENTION

1. Field of the Invention

The invention relates to methods for compressing the stored data, and methods for manipulating the compressed data, in numerical solutions involving radiation-type problems, such as, for example, antenna problems solved using the method of moments.

2. Description of the Related Art

Many numerical techniques are based on a "divide and conquer" strategy wherein a complex structure or a complex problem is broken up into a number of smaller, more easily solved problems. Such strategies are particularly useful for solving integral equation problems involving radiation, heat transfer, scattering, mechanical stress, vibration, and the like. In a typical solution, a larger structure is broken up into a number of smaller structures, called elements, and the coupling or interaction between each element and every other element is calculated. For example, if a structure is broken up into 16 elements, then the inter-element mutual interaction (or coupling) between each element and every other element can be expressed as a 16 by 16 interaction matrix.

As computers become more powerful, such element-based numerical techniques are becoming increasingly important. However, when it is necessary to simultaneously keep track of many, or all, mutual interactions, the number of such interactions grows very quickly. The size of the interaction matrix often becomes so large that data compression schemes are desirable or even essential. Also, the number of computer operations necessary to process the data stored in the interaction matrix can become excessive. The speed of the compression scheme is also important, especially if the data in the interaction matrix has to be decompressed before it can be used.

Typically, especially with radiation-type problems involving sound, vibration, stress, temperature, electromagnetic radiation, and the like, elements that are physically close to one another produce strong interactions. Elements that are relatively far apart (usually where distance is expressed in terms of a size, wavelength, or other similar metric) will usually couple less strongly. For example, when describing the sound emanating from a loudspeaker, the sound will change in character relatively quickly in the vicinity of that speaker. If a person standing very near the speaker moves one foot closer, the sound may get noticeably louder. However, if that person is sitting at the other end of a room, and moves one foot closer, then the change in volume of the sound will be relatively small. This is an example of a general property of many physical systems. Often, in describing the interaction of two nearby objects, relatively more detail is needed for an accurate description, while relatively less detail is needed when the two objects are further apart.

As another example, consider a speaker producing sound inside a room. To determine the sound intensity throughout that room, one can calculate the movement (vibration) of the walls and objects in the room. Typically such calculation will involve choosing a large number of evenly spaced locations in the room, and determining how each location vibrates. The vibration at any one location will be a source of sound, which will typically react with every other location in the room. The number of such interactions would be very large and the associated storage needed to describe such interactions can become prohibitively large. Moreover, the computational effort needed to solve the matrix of interactions can become prohibitive.

SUMMARY OF THE INVENTION

The present invention solves these and other problems by providing a compression scheme for interaction data and an efficient method for processing the compressed data without the need to first decompress the data. In other words, the data can be numerically manipulated in its compressed state.

Given a first region containing sources relatively near to each other, and a second region containing sources relatively near to each other, but removed from the first region; one embodiment provides a simplified description of the possible interactions between these two regions. That is, the first region can contain a relatively large number of sources and a relatively large amount of data to describe mutual interactions between sources within the first region. In one embodiment, a reduced amount of information about the sources in the first region is sufficient to describe how the first region interacts with the second region. One embodiment includes a way to find these reduced interactions with relatively less computational effort than in the prior art.

For example, one embodiment includes a first region of sources in one part of a problem space, and a second region of sources in a portion of the problem space that is removed from the first region. Original sources in the first region are modeled as composite sources (with relatively fewer composite sources than original sources). In one embodiment, the composite sources are described by linear combinations of the original sources. The composite sources are reacted with composite testers to compute interactions between the composite sources and composite testers in the two regions. The use of composite sources and composite testers allows reactions in the room (between regions that are removed from each other) to be described using fewer matrix elements than if the reactions were described using the original sources and testers. While an interaction matrix based on the original sources and testers is typically not a sparse matrix, the interaction matrix based on the composite sources and testers is typically a sparse matrix having a block structure.

One embodiment is compatible with computer programs that store large arrays of mutual interaction data. This is useful since it can be readily used in connection with existing computer programs. In one embodiment, the reduced features found for a first interaction group are sufficient to calculate interactions with a second interaction group or with several interaction groups. In one embodiment, the reduced features for the first group are sufficient for use in evaluating interactions with other interaction groups some distance away from the first group. This permits the processing of interaction data more quickly even while the data remains in a compressed format. The ability to perform numerical operations using compressed data allows fast processing of data using multi-level and recursive methods, as well as using single-level methods.

One embodiment includes transforming the propagating modes to give different sources with a new property. In one embodiment, the sources are directional sources that produce a directional effect at relatively large distances. The directional effect is relatively weak for many angular directions and relatively stronger for some angular directions. These directional sources correspond to directional propagating modes. Since directional propagating modes produce weak interactions at many angles, the corresponding interaction data will have many small values. Often many of these small interaction values can be approximated by zero, within acceptable accuracy limits. The cumulative result is that first there is compression associated with the creation of non-propagating modes. Second, by creating directional propagating modes from the propagating modes, there is compression for the data associated with the propagating modes. In one embodiment directional propagating modes are created directly, without a first step of creating non-propagating modes.

One embodiment includes transforming existing sources into directional propagating sources. The existing sources can be distributed over a surface, throughout a volume, or both. Any distribution of sources is permitted. Other examples include distribution along a one dimensional surface or along a surface with some fractal dimension, or some combination of the distributions previously mentioned. Many existing computer programs have grids that often have been developed without regard to any considerations relative to propagating modes or to directional propagating modes. The teachings herein can be applied to any such grid. It is not necessary for the grid to be smooth. This is especially useful since it simplifies modification of existing computer programs which using some underlying grid. Grids are generally used as an aid in defining the locations and character of the basic sources used in computations. When such grids are not used, the sources can still be deployed in whatever manner is desired and this method can still be applied.

One embodiment uses first sources and creates directional propagating modes from the first sources. In one embodiment, the Basic Method is used to transform sources into propagating modes and non-propagating modes. This generally reduces the number of propagating modes, which generally is advantageous. Then, the propagating modes are considered and are transformed into directional propagating modes. In one embodiment, a transformation creates both non-propagating modes and directional propagating modes.

One embodiment includes partitioning the sources into groups of sources, according to a physical region, as is done in the Basic Method. For each region, a transformation is computed as follows. Choose substantially equally spaced angles in all directions of interest as is done in the Basic Method. Pick the number of angles thus chosen to be equal to the number of sources. For simplicity, consider a problem where the effect produced by a source can be described by one number. Then, a square matrix can be produced, with each row corresponding to a direction or angle and each column to a source. The elements of this matrix can then be defined as the effect at that angle produced by that source at a specified large distance from some point. This matrix is called A.

The inverse of A, denoted as $A^{-1}$, is also a square matrix. The matrix A is constructed for a desired physical region. Any composite source for this same region can be described by a vector v. Each element of this vector v describes the strength of one of the individual sources for this region. It is useful to define the identity vector $e_r$ as a vector with all zero elements, except in the r-th position where it has a one. Construct a composite source $v_r$ by $v_r = A^{-1} e_r$. It is easy to find how the composite source $v_r$ produces an effect for each of the angles previously chosen. Multiplying by A gives that result, which is: $A v_r = A A^{-1} e_r = e_r$.

The composite source $v_r$ creates a strong effect in the r-th direction, and it creates zero effect for directions corresponding to the r–1 directions previously chosen. Unfortunately, for angles close to these r–1 directions, the effect will generally not be weak.

The source $v_r$ produces an effect in the r-th direction (of strength one) and no effect (i.e. an effect of zero strength) at all of the other specified angles. That is, each source produces zero effect on a dense grid of angles. Nevertheless, it generally does not necessarily produce essentially zero effect for angles in between the angles specified by this grid. (This is different from the grid of locations described above. This is a grid of angles or of directions.) Thus, when all angles are considered, not just angles on the grid, each source may produce a strong effect at most of these angles. Thus, these sources are typically not sufficiently directional propagating sources. Producing directional propagating sources requires more care.

It is helpful to understand the physical characteristics of the composite sources developed in the Basic Method. Generally (but not always, as for example, possibly in the case of wavelets, etc.) all or nearly all of these sources have some propagating component. The Basic Method used a procedure to separate the propagating and non-propagating components of these modes. This procedure can be interpreted as an optimization method (which in one embodiment used a Singular Value Decomposition). That is, in a certain sense the propagating modes had relatively little non-propagating content. Modes with this property are referred to herein as Strongly Propagating modes.

In one embodiment, directional propagating modes are constructed by: i) constructing strongly propagating modes; ii) defining angles (or directions) of interest as in the Basic Method, partitioned into ranges of directions, which tend to be physically contiguous and which are physically achievable based on the sources used; and iii) constructing at least one group of new sources for each range of directions, by using linear combinations of the sources from (i). The new sources associated with one range of directions give a strong effect over that range of directions. For example, an optimization procedure can be used to optimize the strength of their effect over this range of directions. Each group of new sources is a group of directional propagating modes.

A range of directions is physically achievable when the sources used can create an effect limited to approximately only that range. For example, if all of the sources have a certain symmetry property and as a result their effect must have that property, then the range of directions can have substantially that same symmetry in order to be physically achievable. For example, if each one of the sources produces an effect at (x,y,z) which is the same as the effect produced at (−x, y, z), then this will also be true for any combination of the sources. Thus, a range of angles having this same symmetry can be used. Also, the term range of directions will also include polarization effects, such as the polarization of the effect of the sources. The step described above of partitioning the directions into ranges of directions generally indicates that the ranges thus formed do not overlap. However, in other embodiments these ranges can overlap.

As a result of the three steps above, a composite source so constructed will tend to have a weak effect over other ranges of directions. It is not always necessary to explicitly enforce all three of these conditions. For example, if conditions (ii) and (iii) are enforced, it is not always essential to explicitly enforce (i). In some cases the optimization procedure in (iii) will automatically enforce (i). However, in many but not all cases it can be desirable to also enforce (i). Moreover, in some circumstances, the optimization is easier if step (i) has been performed.

The term "range of physical directions" generally implies that the range is large enough. Considering the grid of angles used in creating the matrix A previously discussed, the range around one such angle but not including others in the grid generally is not large enough. Typically, a "range of physical directions" implies a larger range than that. The term "tends to be physically continuous" suggests avoiding ranges that are highly disjoint, unless that is necessary to be "physically achievable."

BRIEF DESCRIPTION OF THE FIGURES

The advantages and features of the disclosed invention will readily be appreciated by persons skilled in the art from the following detailed description when read in conjunction with the drawings listed below.

Figure 1A:
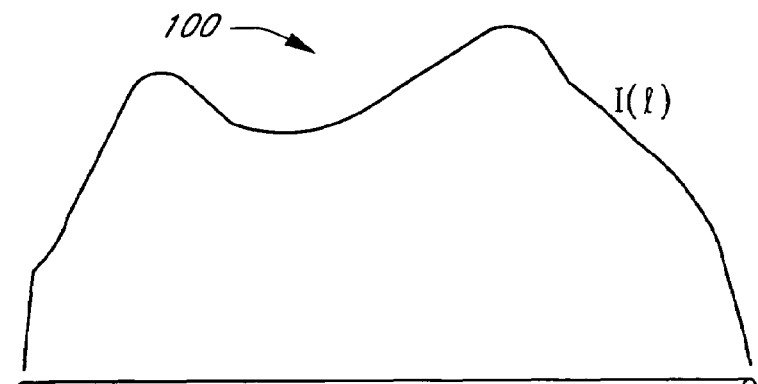
FIG. 1A illustrates a wire or rod having a physical property (e.g., a current, a temperature, a vibration, stress, etc.) I(l) along its length, where the shape of I(l) is unknown.

In the drawings, the first digit of any three-digit number generally indicates the number of the figure in which the element first appears. Where four-digit reference numbers are used, the first two digits indicate the figure number.

DETAILED DESCRIPTION

Many physical phenomena involve sources that generate a disturbance, such as an electromagnetic field, electromagnetic wave, a sound wave, vibration, a static field (e.g., electrostatic field, magnetostatic field, gravity field, etc) and the like. Examples of sources include a moving object (such as a loudspeaker that excites sound waves in air) and an electrical current (that excites electric and magnetic fields), etc. For example, the electric currents moving on an antenna produce electromagnetic waves. Many sources produce disturbances both near the source and at a distance from the source.

Sometimes it is convenient to consider disturbances as being created by an equivalent source (e.g., a fictitious source) rather than a real physical source. For example, in most regions of space (a volume of matter for example) there are a large number of positive electric charges and a large number of negative electric charges. These positive and negative charges nearly exactly cancel each other out. It is customary to perform calculations using a fictitious charge, which is the net difference between the positive and negative charge, averaged over the region of space. This fictitious charge usually cannot be identified with any specific positive or negative particle.

A magnetic current is another example of a fictitious source that is often used. It is generally assumed that magnetic monopoles and magnetic currents do not exist (while electric monopoles and electric currents do exist). Nevertheless, it is known how to mathematically relate electric currents to equivalent magnetic currents to produce the same electromagnetic waves. The use of magnetic sources is widely accepted, and has proven very useful for certain types of calculations. Sometimes, it is convenient to use a source that is a particular combination of electric and magnetic sources. A distribution of sources over some region of space can also be used as a source. The terms "sources" and "physical sources" are used herein to include all types of actual and/or fictitious sources.

A physical source at one location typically produces a disturbance that propagates to a sensor (or tester) at another location. Mathematically, the interaction between a source and a tester is often expressed as a coupling coefficient (usually as a complex number having a real part and an imaginary part). The coupling coefficients between a number of sources and a number of testers is usually expressed as an array (or matrix) of complex numbers. Embodiments of this invention includes efficient methods for the computation of these complex numbers, for the storing of these complex numbers, and for computations using these complex numbers.

The so-called Method of Moments (MoM) is an example of numerical analysis procedure that uses interactions between source functions and testing functions to numerically solve a problem that involves finding an unknown function (that is, where the solution requires the determination of a function of one or more variables). The MoM is used herein by way of example and not as a limitation. One skilled in the art will recognize that the MoM is one of many types of numerical techniques used to solve problems, such as differential equations and integral equations, where one of the unknowns is a function. The MoM is an example of a class of solution techniques wherein a more difficult or unsolvable problem is broken up into one or more interrelated but simpler problems. Another example of this class of solution techniques is Nystrom's method. The simpler problems are solved, in view of the known interrelations between the simpler problems, and the solutions are combined to produce an approximate solution to the original, more difficult, problem.

For example, FIG. 1A shows a wire or rod 100 having a physical property (e.g., a current, a temperature, a stress, a voltage, a vibration, a displacement, etc.) along its length. An expression for the physical property is shown as an unknown function I(l). The problem is to calculate I(l) using the MoM or a similar "divide and conquer" type of technique. By way of example, in many physical problems involving temperature, vibration, or electrical properties, etc. I(l) will be described by an integral equation of the form:

$$E(\overline{R}) = \int I(l) G(l, \overline{R}) dl$$

Where $G(l, \overline{R})$ is known everywhere and $E(\overline{R})$ is known for certain values of $\overline{R}$. In many circumstances, $G(l,\overline{R})$ is a Green's function, based on the underlying physics of the problem, and the value of $E(\overline{R})$ is known only at boundaries (because of known boundary conditions). The above equation is usually not easily solved because I(l) is not known, and thus the integration cannot be performed. The above integral equation can be turned into a differential equation (by taking the derivative of both sides), but that will not directly provide a solution. Regardless of whether the above equation is expressed as an integral equation or a differential equation, the equation can be numerically solved for I(l) by creating a set of simpler but interrelated problems as described below (provided that $G(l, \overline{R})$ possesses certain mathematical properties known to those of skill in the art).

Figure 1B:
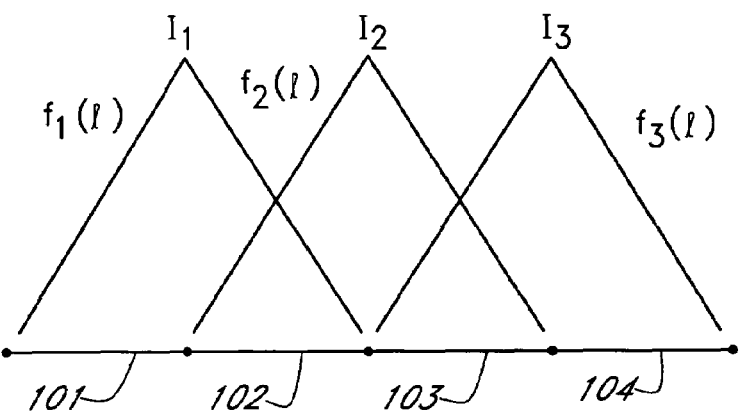
FIG. 1B illustrates the wire from FIG. 1A, broken up into four segments, where the function I(l) has been approximated by three known basis functions $f_i(l)$, and where each basis function is multiplied by an unknown constant $I_i$.

As shown in FIG. 1B, in order to compute a numerical approximation for I(l), the wire 100 is first divided up into four segments 101-104, and basis function $f_1(l)$, $f_2(l)$, and $f_3(l)$ are selected. In FIG. 1B the basis functions are shown as triangular-shaped functions that extend over pairs of segments. The unknown function I(l) can then be approximated as:

$$I(l) \approx I_1 f_1(l) + I_2 f_2(l) + I_3 f_3(l)$$

where $I_1$, $I_2$, and $I_3$ are unknown complex constants. Approximating I(l) in this manner transforms the original problem from one of finding an unknown function, to a problem of finding three unknown constants. The above approximation for I(l) is inserted into the original integral equation above to yield:

$$E(\overline{R}) = I_1 \int f_1(l) G(l, \overline{R}) dl + I_2 \int f_2(l) G(l, \overline{R}) dl + I_3 \int f_3(l) G(l, \overline{R}) dl$$

The above integrals can now be performed because the functional form of the integrands are all known ($G(l,\overline{R})$ is determined by the problem being solved, the functions $f_i(\,)$ were selected, and the constants $I_1$, $I_2$ and $I_3$ can be moved outside the integrals). However, this does not yet solve the problem because the values of $I_1$, $I_2$ and $I_3$ are still unknown.

Fortunately, as indicated above, the value of $E(\overline{R})$ is usually known at various specific locations (e.g., at boundaries). Thus, three equations can be written by selecting three locations $\overline{R}_1$, $\overline{R}_2$, $\overline{R}_3$, where the value of $E(\overline{R})$ is known. Using these three selected locations, the above equation can be written three times as follows:

$$E(\overline{R}_1) = I_1 \int f_1(l) G(l, \overline{R}_1) dl + I_2 \int f_2(l) G(l, \overline{R}_1) dl + I_3 \int f_3(l) G(l, \overline{R}_1) dl$$

$$E(\overline{R}_2) = I_1 \int f_1(l) G(l, \overline{R}_2) dl + I_2 \int f_2(l) G(l, \overline{R}_2) dl + I_3 \int f_3(l) G(l, \overline{R}_2) dl$$

$$E(\overline{R}_3) = I_1 \int f_1(l) G(l, \overline{R}_3) dl + I_2 \int f_2(l) G(l, \overline{R}_3) dl + I_3 \int f_3(l) G(l, \overline{R}_3) dl$$

Rather than selecting three specific locations for $E(\overline{R})$, it is known that the accuracy of the solution is often improved by integrating known values of $E(\overline{R})$ using a weighting function over the region of integration. For example, assuming that $E(\overline{R})$ is known along the surface of the wire 100, then choosing three weighting functions $g_1(l)$, $g^2(l)$, and $g_3(l)$, the desired three equations in three unknowns can be written as follows (by multiplying both sides of the equation by $g_i(l)$ and integrating):

$$\int E(l') g_1(l') dl' = I_1 \int\int f_1(l) g_1(l') G(l, l') dl\, dl' +$$
$$I_2 \int\int f_2(l) g_1(l') G(l, l') dl\, dl' +$$
$$I_3 \int\int f_3(l) g_1(l') G(l, l') dl\, dl'$$

$$\int E(l') g_2(l') dl' = I_1 \int\int f_1(l) g_2(l') G(l, l') dl\, dl' +$$
$$I_2 \int\int f_2(l) g_2(l') G(l, l') dl\, dl' +$$
$$I_3 \int\int f_3(l) g_2(l') G(l, l') dl\, dl'$$

$$\int E(l') g_3(l') dl' = I_1 \int\int f_1(l) g_3(l') G(l, l') dl\, dl' +$$
$$I_2 \int\int f_2(l) g_3(l') G(l, l') dl\, dl' +$$
$$I_3 \int\int f_3(l) g_3(l') G(l, l') dl\, dl'$$

Note that the above double-integral equations reduce to the single-integral forms if the weighting functions $g_i(l)$ are replaced with delta functions.

The three equations in three unknowns can be expressed in matrix form as:

$$V = ZI$$

or $$\begin{bmatrix} V_1 \\ V_2 \\ V_3 \end{bmatrix} = \begin{bmatrix} Z_{11} & Z_{12} & Z_{13} \\ Z_{21} & Z_{22} & Z_{23} \\ Z_{31} & Z_{32} & Z_{33} \end{bmatrix} \begin{bmatrix} I_1 \\ I_2 \\ I_3 \end{bmatrix}$$

where $$V_i = \int E(l') g_i(l') dl'$$

and $$Z_{ij} = \iint f_j(l) g_i(l') G(l, l') dl dl'$$

Figure 1C:
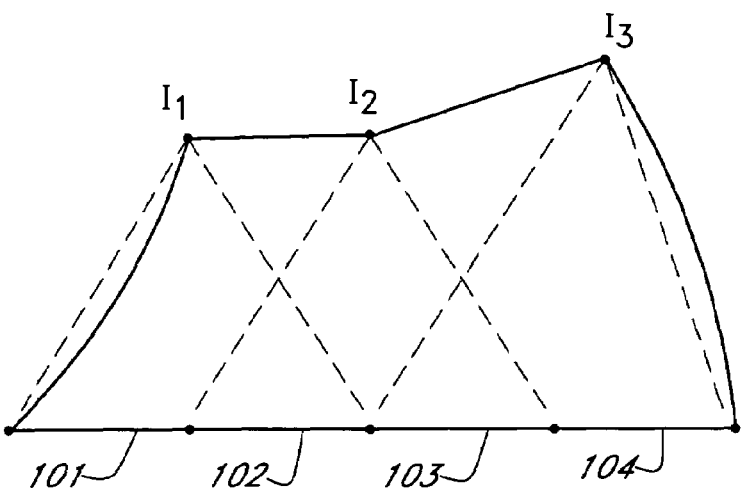
FIG. 1C illustrates a piecewise linear approximation to the function I(l) after the constants $I_i$ have been determined.

Solving the matrix equation yields the values of $I_1$, $I_2$, and $I_3$. The values $I_1$, $I_2$, and $I_3$ can then be inserted into the equation $I(l) \approx I_1 f_1(l) + I_2 f_2(l) + I_3 f_3(l)$ to give an approximation for $I(l)$. If the basis functions are triangular functions as shown in FIG. 1B, then the resulting approximation for $I(l)$ is a piecewise linear approximation as shown in FIG. 1C. The $I_i$ are the unknowns and the $V_i$ are the conditions (typically, the $V_i$ are knowns). Often there are the same number of conditions as unknowns. In other cases, there are more conditions than unknowns or less conditions than unknown.

The accuracy of the solution is largely determined by the shape of the basis functions, by the shape of the weighting functions, and by the number of unknowns (the number of unknowns usually corresponds to the number of basis functions).

Unlike the Moment Method described above, some techniques do not use explicit basis functions, but, rather, use implicit basis functions or basis-like functions. For example, Nystrom's method produces a numerical value for an integral using values of the integrand at discrete points and a quadrature rule. Although Nystrom's method does not explicitly use an expansion in terms of explicit basis functions, nevertheless, in a physical sense, basis functions are still being used (even if the use is implicit). That is, the excitation of one unknown produces some reaction throughout space. Even if the computational method does not explicitly use a basis function, there is some physical excitation that produces approximately the same reactions. All of these techniques are similar, and one skilled in the art will recognize that such techniques can be used with the present invention. Accordingly, the term "basis function" will be used herein to include such implicitly used basis functions. Similarly, the testers can be implicitly used.

When solving most physical problems (e.g., current, voltage, temperature, vibration, force, etc), the basis functions tend to be mathematical descriptions of the source of some physical disturbance. Thus, the term "source" is often used to refer to a basis function. Similarly, in physical problems, the weighting functions are often associated with a receiver or sensor of the disturbance, and, thus, the term "tester" is often used to refer to the weighting functions.

As described above in connection with FIGS. 1A-1C, in numerical solutions, it is often convenient to partition a physical structure or a volume of space into a number of smaller pieces and associate the pieces with one or more sources and testers. In one embodiment, it is also convenient to partition the structure of (or volume) into regions, where each region contains a group of the smaller pieces. Within a given region, some number of sources is chosen to describe with sufficient detail local interactions between sources and testers within that region. A similar or somewhat smaller number of sources in a given region is generally sufficient to describe interactions between sources in the source region and testers in the regions relatively close by. When the appropriate sources are used, an even smaller number of sources is often sufficient to describe interactions between the source region and testers in regions that are not relatively close by (i.e., regions that are relatively far from the source region).

Embodiments of the present invention include methods and techniques for finding composite sources. Composite sources are used in place of the original sources in a region such that a reduced number of composite sources is needed to calculate the interactions with a desired accuracy.

In one embodiment, the composite sources for a first region are the same regardless of whether the composite sources in the first region are interacting with a second region, a third region, or other regions. The use of the same composite sources throughout leads to efficient methods for factoring and solving the interaction matrix.

Considering the sources in the first region, one type of source is the so-called multipole, as used in a multipole expansion. Sources like wavelets are also useful. In some cases wavelets allow a reduced number of composite sources to be used to describe interactions with distant regions. However, there are disadvantages to wavelet and multipole approaches. Wavelets are often difficult to use, and their use often requires extensive modifications to existing or proposed computer programs. Wavelets are difficult to implement on non-smooth and non-planar bodies.

Multipole expansions have stability problems for slender regions. Also, while a multipole expansion can be used for describing interactions with remote regions, there are severe problems with using multipoles for describing interactions within a region or between spatially close regions. This makes a factorization of the interaction matrix difficult. It can be very difficult to determine how to translate information in an interaction matrix into a wavelet or multipole representation.

Figure 2:
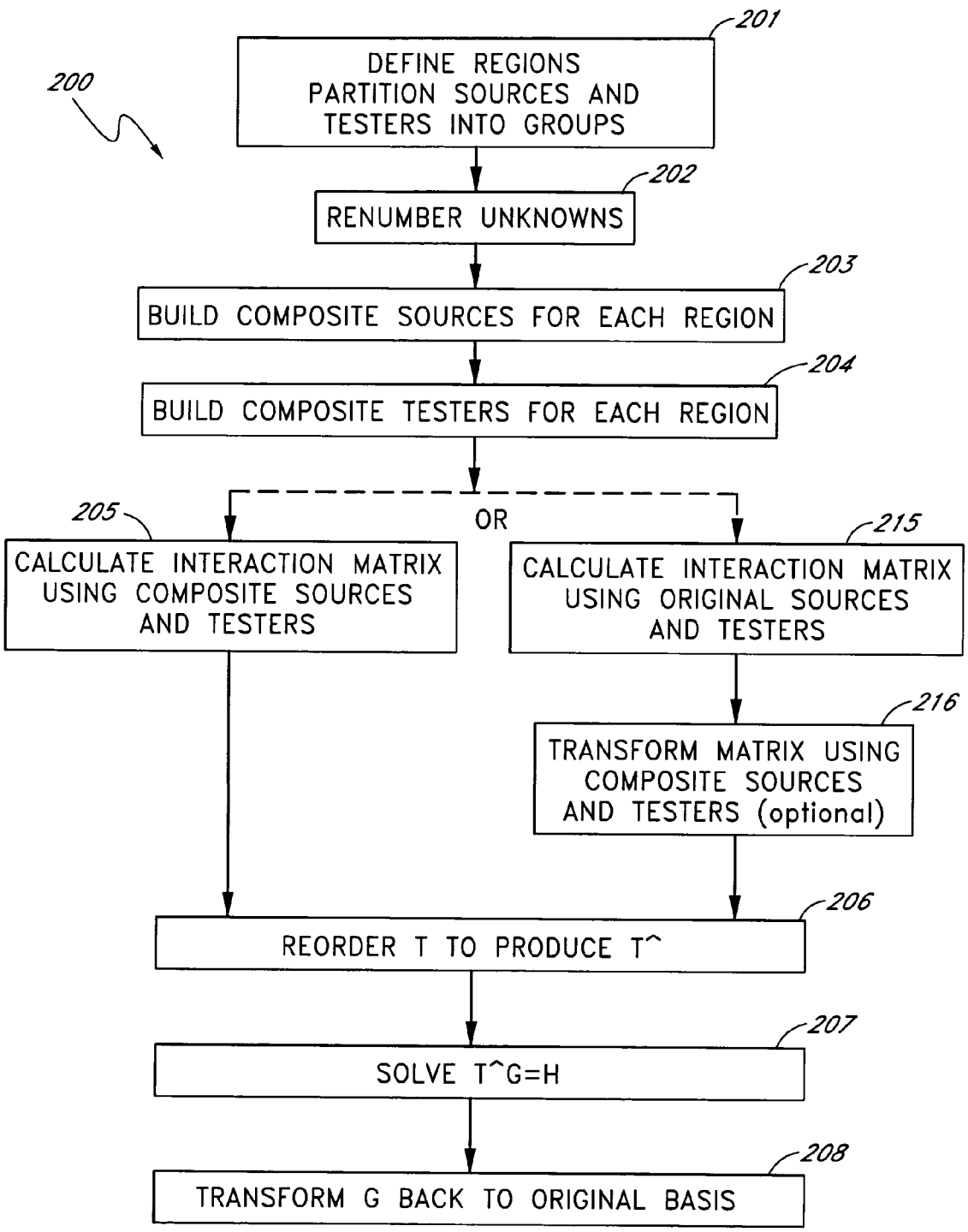
FIG. 2 is a flowchart showing the process steps used to generate a compressed (block sparse) interaction matrix.

FIG. 2 is a flowchart that illustrates a compression technique 200 for compressing an interaction matrix by combining groups of sources and groups of testers into composite sources and testers. The use of composite sources and composite testers allows the original interaction matrix to be transformed into a block sparse matrix having certain desirable properties.

Embodiments of the present invention include a technique for computing and using composite sources to provide compression of an interaction matrix by transforming the interaction matrix into a block sparse matrix. The present technique is compatible with existing and proposed computer programs. It works well even for rough surfaces and irregular grids of locations. For a given region, the composite sources allow computation of a disturbance (e.g., radiation) produced by the source throughout a desired volume of space. A reduced number of these composite sources is sufficient to calculate (with a desired accuracy) disturbances at other relatively distant regions. This method of compressing interaction data can be used with a variety of computational methods, such as, for example, an LU (Lower Triangular Upper triangular) factorization of a matrix or as a preconditioned conjugate gradient iteration. In many cases, the computations can be done while using the compressed storage format.

FIG. 2 is a flowchart 200 illustrating the steps of solving a numerical problem using composite sources. The flowchart 200 begins in a step 201 where a number of original sources and original testers are collected into groups, each group corresponding to a region. Each element of the interaction matrix describes an interaction (a coupling) between a source and a tester. The source and tester are usually defined, in part, by their locations in space. The sources and testers are grouped according to their locations in space. In one embodiment, a number of regions of space are defined. A reference point is chosen for each region. Typically the reference point will lie near the center of the region. The sources and testers are grouped into the regions by comparing the location of the source or tester to the reference point for each region. Each source or tester is considered to be in the region associated with the reference point closest to the location. (For convenience, the term "location" is used hereinafter to refer to the location of a source or a tester.)

Other methods for grouping the sources and testers (that is, associating locations with regions) can also be used. The process of defining the regions is problem-dependent, and in some cases the problem itself will suggest a suitable set of regions. For example, if the sources and testers are located on the surface of a sphere, then curvilinear-square regions are suggested. If the sources and testers are located in a volume of space, then cubic regions are often useful. If the sources and testers are located on a complex three-dimensional surface, then triangular patch-type regions are often useful.

Figure 3:
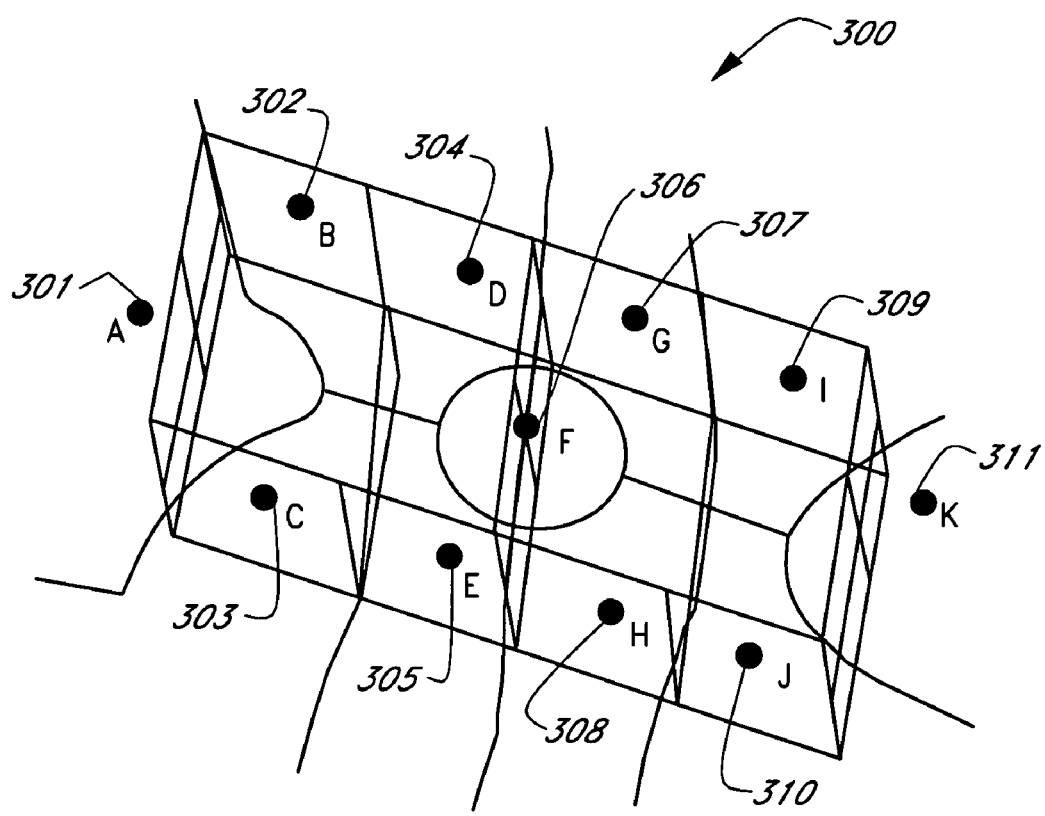
FIG. 3 illustrates partitioning a body into regions.

Generally the way in which the regions are defined is not critical, and the process used to define the regions will be based largely on convenience. However, it is usually preferable to define the regions such that the locations of any region are relatively close to each other, and such that there are relatively few locations from other regions close to a given region. In other words, efficiency of the compression algorithm is generally improved if the regions are as isolated from one another as reasonably possible. Of course, adjacent regions are often unavoidable, and when regions are adjacent to one another, locations near the edge of one region will also be close to some locations in an adjacent region. Nevertheless, the compression will generally be improved if, to the extent reasonably possible, regions are defined such that they are not slender, intertwining, or adjacent to one another. For example, FIG. 3 illustrates a volume of space partitioned into a rectangular box 300 having eleven regions A through K corresponding to reference points 301-311.

As shown in FIG. 2, after the step 201 the process advances to a step 202. In the step 202, the unknowns are renumbered, either explicitly or implicitly, so that locations within the same region are numbered consecutively. It is simpler to continue this description as if the renumbering has actually been done explicitly. However, the following analysis can also be performed without explicit renumbering.

The term "spherical angles" is used herein to denote these angles. One skilled in the art will recognize that if a two-dimensional problem is being solved, then the spherical angles reduces to a planar angle. Similarly, one skilled in the art will recognize that if a higher-dimensional problem is being solved (such as, for example, a four dimensional space having three dimensions for position and one dimension for time) then the term spherical angle denotes the generalization of the three-dimensional angle into four-dimensional space. Thus, in general, the term spherical angle is used herein to denote the notion of a "space-filling" angle for the physical problem being solved.

After renumbering, the process advances to a block 203 where one or more composite sources for each region are determined. If there are p independent sources within a region, then q composite sources can be constructed (where $q \leq p$). The construction of composite sources begins by determining a relatively dense set of far-field patterns (usually described in a spherical coordinate system) at relatively large distances from the region. As used herein, far-field refers to the field in a region where the field can be approximated in terms of an asymptotic behavior. For example, in one embodiment, the far-field of an antenna or other electromagnetic radiator includes the field at some distance from the antenna, where the distance is relatively larger than the electrical size of the antenna.

A far-field pattern is constructed for each independent source. In the present context, dense means to avoid having any overly-large gaps in the spherical angles used to calculate the set of disturbances. Dense also means that if the disturbance is represented by a vector, then each vector component is represented. For example, for a scalar problem, one can choose p spherical angles. These angles are typically substantially equally spaced, and the ranges of angles include the interaction angles occurring in the original interaction matrix (if all of the interactions described in the original matrix lie within a plane, then one can choose directions only within that plane rather than over a complete sphere).

The far-field data is stored in a matrix s having p columns (one column for each source location within the region), and rows associated with angles. While each source is logically associated with a location in a given region, these sources are not necessarily located entirely within that region. While each source corresponds to a location (and each location is assigned to a region), sources that have a physical extent can extend over more than one region. The entries in the matrix s can be, for example, the field quantity or quantities that emanate from each source. It is desirable that the field quantity is chosen such that when it (or they) are zero at some angle then, to a desired approximation, all radiated quantities are zero at that angle. While it is typically desirable that the angles be relatively equally spaced, large deviations from equal spacing can be acceptable.

These composite sources are in the nature of equivalent sources. A smaller number of composite sources, compared to the number of sources they replace, can produce similar disturbances for regions of space removed from the region occupied by these sources.

As described above, sources are collected into groups of sources, each group being associated with a region. For each group of sources, a group of composite sources is calculated. The composite source is in the nature of an equivalent source that, in regions of space removed from the region occupied by the group in replaces, produces a far-field (disturbance) similar to the field produced by the group it replaces. Thus, a composite source (or combination of composite sources) efficiently produces the same approximate effects as the group of original sources at desired spherical angles and at a relatively large distance. To achieve a relatively large distance, is it often useful to use a limiting form as the disturbance goes relatively far from its source.

Each composite source is typically a linear combination of one or more of the original sources. A matrix method is used to find composite sources that broadcast strongly and to find composite sources that broadcast weakly. These composite sources are constructed from the original sources. The matrix method used to find composite sources can be a rank-revealing factorization such as singular value decomposition. For a singular value decomposition, the unitary transformation associated with the sources gives the composite sources as a linear combination of sources.

Variations of the above are possible. For example, one can apply the singular value decomposition to the transpose of the s matrix. One can employ a Lanczos Bi-diagonalization, or related matrix methods, rather than a singular value decomposition. There are other known methods for computing a low rank approximation to a matrix. Some examples of the use of Lanczos Bidiagonalization are given in Francis Canning and Kevin Rogovin, "Fast Direct Solution of Standard Moment-Method Matrices," IEEE AP Magazine, Vol. 40, No. 3, June 1998, pp. 15-26.

There are many known methods for computing a reduced rank approximation to a matrix. A reduced rank approximation to a matrix is also a matrix. A reduced rank matrix with m columns can be multiplied by any vector of length m. Composite sources that broadcast weakly are generally associated with the space of vectors for which that product is relatively small (e.g., in one embodiment, the product is zero or close to zero). Composite sources that broadcast strongly are generally associated with the space of vectors for which that product is not necessarily small.

Composite sources can extend over more than one region. In one embodiment, this is achieved by using the technique used with Malvar wavelets (also called local cosines) to extend Fourier transforms on disjoint intervals to overlapping orthogonal functions.

Persons of ordinary skill in the art know how near-field results are related to far-field results. A relationship between near-field and far-field can be used in a straightforward way to transform the method described above using far-field data into a method using near-field data. Note that, the "far-field" as used herein is not required to correspond to the traditional $2d^2/\lambda$ far-field approximation. Distances closer than $2d^2/\lambda$ can be used (although closer distances will typically need more composite sources to achieve a desired accuracy). A distance corresponding to the distance to other physical regions is usually far enough, and even shorter distances can be acceptable.

Once composite sources are found, the process advances to a step 204 where composite testers are found. Composite testers are found in a manner analogous to the way that composite sources are found. Recall that composite sources are found using the way in which sources of the interaction matrix "broadcast" to distant locations. Composite testers are found using the way in which the testers of the interaction matrix "receive" from a dense group of directions for a distant disturbance. It is helpful if the received quantity or quantities which are used include relatively all field quantities, except (optionally) those which are very weakly received. For example, when receiving electromagnetic radiation from a distant source, the longitudinal component is approximately zero and can often be neglected. A matrix R describing how these testers receive is formed. A matrix method is used to construct composite testers that receive strongly and testers that receive weakly. The matrix method can be a rank-revealing factorization such as singular value decomposition. A singular value decomposition gives the composite testers as a linear combination of the testers which had been used in the original matrix description.

Figure 4:
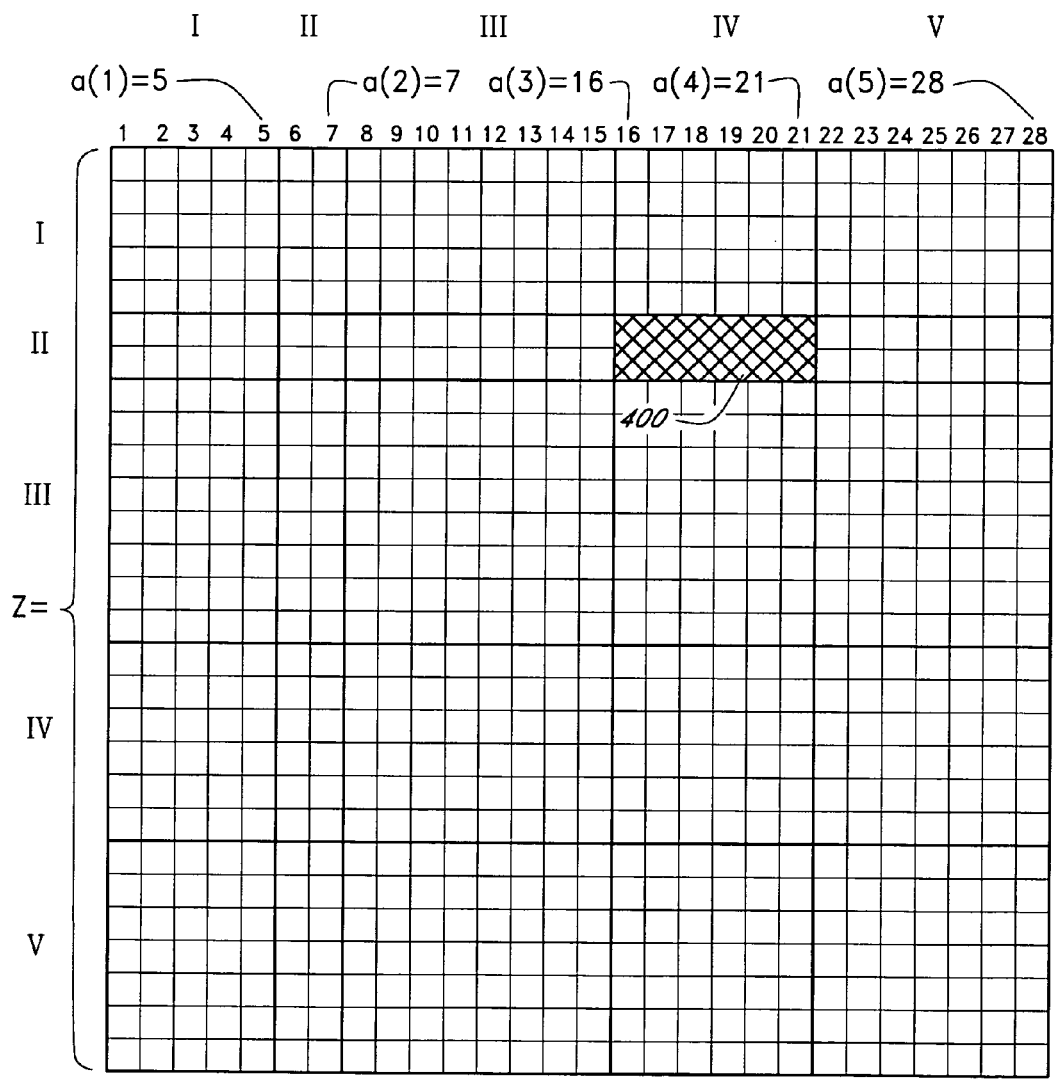
FIG. 4 shows an example of an interaction matrix (before transformation) for a body partitioned into five differently sized regions.

Once composite sources and testers have been found, the process advances to a step 205 or to a step 215 where the interaction matrix is transformed to use composite sources and testers. The steps 205 and 215 are alternatives. FIG. 4 shows an example of an interaction matrix 400 having 28 unknowns (28 sources and 28 testers) grouped into five physical regions (labeled I-V). The shaded block 401 of the matrix 400 represents the interaction for sources in the fourth region (region IV) and testers in the second region (region II). The interaction of a pair of regions describes a block in the interaction matrix 400. The blocks of the transformed matrix can be computed at any time after the composite functions for their source and tester regions are both found. That is, the block 401 can be computed after composite sources for region IV and testers for region II are found.

The step 215 of FIG. 2 shows one method for computing all of the blocks in the matrix 400 by computing the entries for these blocks using the original sources and testers. Then, the process advances to an optional step 216 where these blocks are transformed into a description in terms of the composite sources and composite testers.

One advantage of using composite sources and testers is that many entries in the transformed matrix will be zero. Therefore, rather than transforming into a description using composite modes, the step 205 shows calculation of the transformed block directly using the composite sources and composite testers (without first calculating the block using the original sources and testers). In other words, the composite sources are used as basis functions, and the composite testers are used as weighting functions. Within each block, entries that are known au priori to be zero (or very small) are not calculated.

Further savings in the storage required are possible. After each block has been transformed, only the largest elements are kept. No storage needs to be used for the elements that are approximately zero. Many types of block structures, including irregular blocks and multilevel structures, can also be improved by the use of this method for storing a block sparse matrix. This will usually result in a less regular block structure. As an alternative, it is also possible to store a portion of the interaction data using composite sources and testers and to store one or more other portions of the data using another method.

Figure 5:
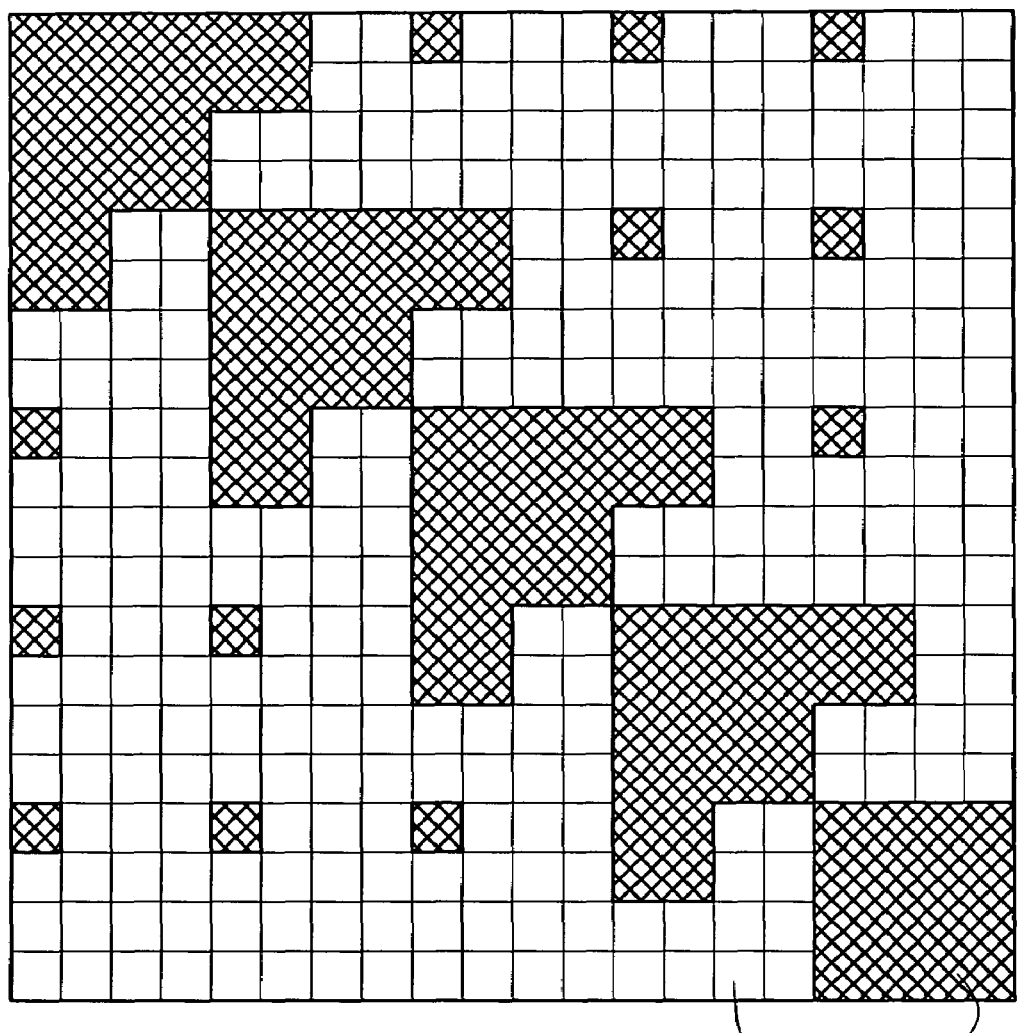
FIG. 5 shows an example of an interaction matrix after transformation (but before reordering) for a body partitioned into five regions of uniform size.

The non-zero elements of the interaction matrix typically occur in patterns. After either the step 205 or the step 216, the process advances to a step 206 where the interaction matrix is reordered to form regular patterns. For a more uniform case, where all of the regions have the same number of sources, the resulting transformed matrix T is shown in FIG. 5. FIG. 5 shows non-zero elements as shaded and zero elements as unshaded. If only a compressed storage scheme is desired, the process can stop here. However, if it is desired to calculate the inverse of this matrix, or something like its LU (lower-upper triangular) factorization, then a reordering can be useful.

Figure 6:
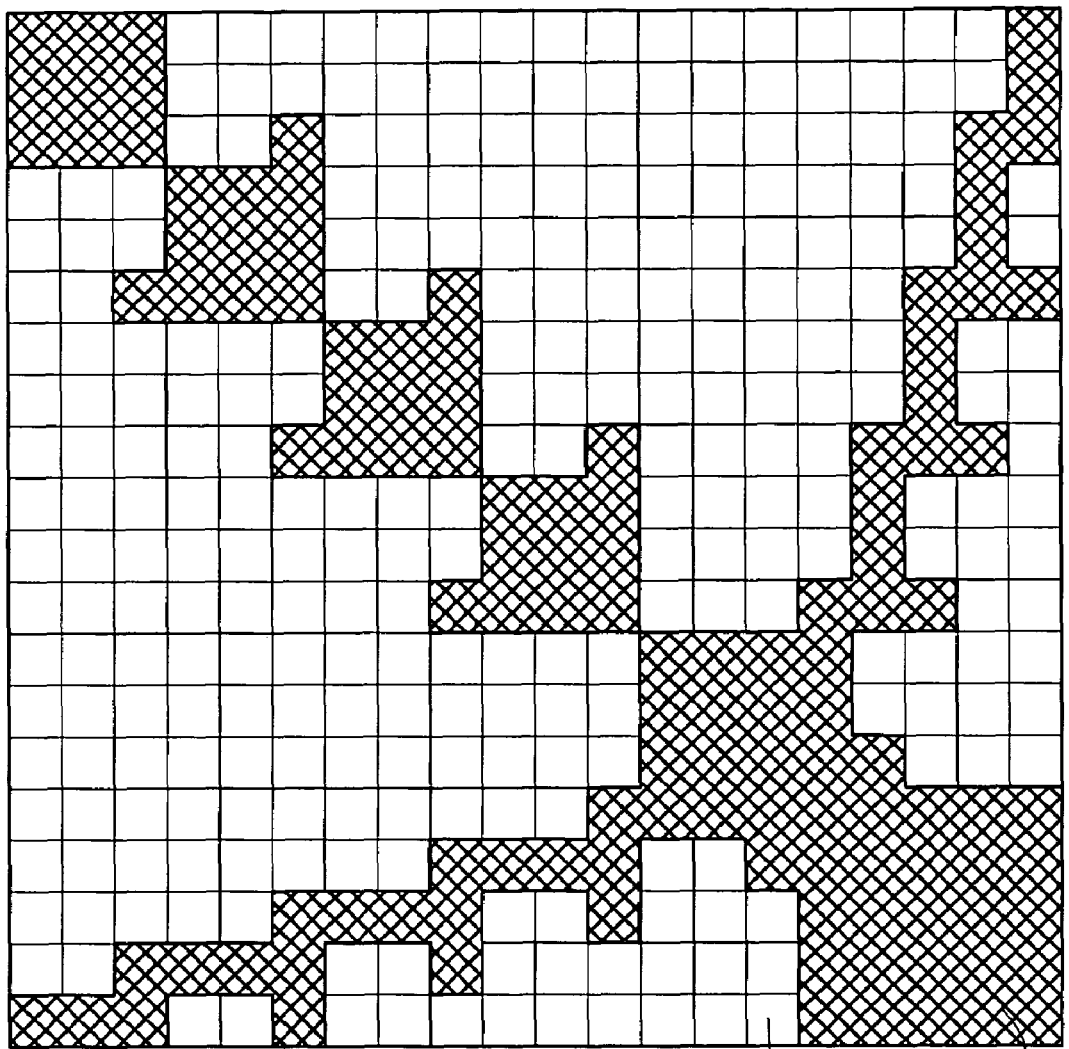
FIG. 6 shows an example of an interaction matrix after transformation and reordering for a body partitioned into five regions of uniform size.

The rows and columns of the interaction matrix can be reordered, to produce a matrix T^ in the form shown in FIG. 6. This permutation moves the composite sources that broadcast strongly to the bottom of the matrix, and it moves the composite testers which receive strongly to the right side of the matrix. The interaction between composite sources and composite testers is such that the sizes of the matrix elements can be estimated au priori. A matrix element that corresponds to an interaction between a composite source that radiates strongly and a composite tester that receives strongly will be relatively large. A matrix element that corresponds to an interaction between a composite source that radiates strongly and a composite tester that receives weakly will be relatively small. Similarly, a matrix element that corresponds to an interaction between a composite source that radiates weakly and a composite tester that receives strongly will be relatively small. A matrix element that corresponds to an interaction between a composite source that radiates weakly and a composite tester that receives weakly will be very small.

The permuted matrix T^ often will tend to be of a banded form. That is, the non-zero elements down most of the matrix will tend to be in a band near the diagonal. For a matrix of this form, there are many existing sparse-matrix LU factorers and other matrix solvers, that work well. The order shown in FIG. 6 is one example. The LU decomposition of the matrix T^ can be computed very rapidly by standard sparse matrix solvers.

The matrices L and U of the LU decomposition will themselves be sparse. For problems involving certain types of excitations, only a part of the matrices L and U will be needed, and this can result in further savings in the storage required.

After reordering, the process 200 advances to a step 207 where the linear matrix problem is solved. The matrix problem to be solved is written as:

$$T\hat{\ }G=H$$

where the vector H represents the excitation and the vector G is the desired solution for composite sources. The excitation is the physical cause of the sound, temperature, electromagnetic waves, or whatever phenomenon is being computed. If the excitation is very distant (for example, as for a plane wave source), H will have a special form. If the vector H is placed vertically (as a column vector) alongside the matrix of FIG. 6, the bottom few elements of H alongside block 602, will be relatively large, and the remaining elements of H will be approximately equal to zero. The remaining elements of H are approximately zero because the composite testers separate the degrees of freedom according to how strongly they interact with a distant source.

When $T\hat{\ }$ is factored by LU decomposition, then:

$$T\hat{\ }=LU;$$

$$L\ U\ G=H;$$

and this is solved by the following two-step process;

| Step I: | Find X in | LX = H |
| Step II: | Find G in | UG = X |

The matrix L is a lower triangular matrix (meaning elements above its diagonal are zero). It follows immediately from this that if only the bottom few elements of H are non-zero, then only the bottom elements of X are non-zero. As a consequence, only the bottom right portion of L is needed to compute G. The remaining parts of L were used in computing this bottom right portion, but need not be kept throughout the entire process of computing the LU decomposition. This not only results in reduced storage, but also results in a faster computation for Step I above.

If only the far-field scattered by an object needs to be found, then further efficiencies are possible. In that case, it is only necessary to find the bottom elements of G, corresponding to the bottom non-zero elements of H. This can be done using only the bottom right portion of the upper triangular matrix U. This results in efficiencies similar to those obtained for L.

For other types of excitations, similar savings are also possible. For example, for many types of antennas, whether acoustic or electromagnetic, the excitation is localized within one active region, and the rest of the antenna acts as a passive scatterer. In that case, the active region can be arranged to be represented in the matrix of FIG. 6 as far down and as far to the right as possible. This provides efficiencies similar to those for the distant excitation.

A permutation of rows and a permutation of columns of the matrix T of FIG. 5 brings it to the matrix $T\hat{\ }$ of FIG. 6. These permutations are equivalent to an additional reordering of the unknowns. Thus, a solution or LU decomposition of the matrix $T\hat{\ }$ of FIG. 6 does not immediately provide a solution to the problem for the original data. Several additional steps are used. These steps involve: including the effects of two permutations of the unknowns; and also including the effect of the transformation from the original sources and testers to using the composite sources and composite testers.

Direct methods (such as LU decomposition) and iterative methods can both be used to solve the matrix equation herein. An iterative solution, with the compressed form of the matrix, can also be used with fewer computer operations than in the prior art. Many iterative methods require the calculation of the product of a matrix and a vector for each iteration. Since the compressed matrix has many zero elements (or elements which can be approximated by zero), this can be done more quickly using the compressed matrix. Thus, each iteration can be performed more quickly, and with less storage, than if the uncompressed matrix were used.

The compressed format of $T\hat{\ }$ has an additional advantage. In many cases, there is a way to substantially reduce the number of iterations required, resulting in further increases in speed. For example, in the method of conjugate gradients, the number of iterations required to achieve a given accuracy depends on the condition number of the matrix. (The condition number of a matrix is defined as its largest singular value divided by its smallest.) Physical problems have a length scale, and one interpretation of these composite sources and composite testers involves length scales. These composite sources and composite testers can be described in terms of a length scale based on a Fourier transform. This physical fact can be used to improve the condition number of the matrix and therefore also improve the speed of convergence of the iterative method.

A composite source is a function of spatial position, and its Fourier transform is a function of "spatial frequency." Composite sources that broadcast weakly tend to have a Fourier transform that is large when the absolute value of this spatial frequency is large. There is a correlation between how large this spatial frequency is and the smallness of the small singular values of the matrix. This correlation is used in the present invention to provide a method to achieve convergence in fewer iterations.

Two matrices, $P^R$ and $P^L$ are defined as right and left preconditioning matrices to the compressed matrix. Each column of the compressed matrix is associated with a composite source. This composite source can be found using a matrix algebra method, such as a rank-revealing factorization (e.g., singular value decomposition and the like). The rank-revealing factorization method provides some indication of the strength of the interaction between that composite source and other disturbances. For example, using a singular value decomposition, the associated singular value is proportional to this strength. The diagonal matrix $P^R$ is constructed by choosing each diagonal element according to the interaction strength for the corresponding composite source. The diagonal element can be chosen to be the inverse of the square root of that strength. Similarly, the diagonal matrix $P^L$ can be constructed by choosing each diagonal element according to the interaction strength for its associated composite tester. For example, the diagonal element can be chosen to be the inverse of the square root of that strength.

If the compressed matrix is called T, then the preconditioned matrix is $$P=P^L\ T\ P^R$$

The matrix P will often have a better (i.e., smaller) condition number than the matrix T. There are many iterative methods that will converge more rapidly when applied to the preconditioned matrix P rather than to T.

One embodiment of the composite source compression technique is used in connection with the computer program NEC2. This program was written at Lawrence Livermore National Laboratory during the 1970s and early 1980s. The NEC2 computer program itself and manuals describing its theory and use are freely available over the Internet. The following development assumes NEC2 is being used to calculate the electromagnetic fields on a body constructed as a wire grid.

NEC2 uses electric currents flowing on a grid of wires to model electromagnetic scattering and antenna problems. In its standard use, NEC2 generates an interaction matrix, herein called the Z matrix. The actual sources used are somewhat complicated. There is at least one source associated with each wire segment. However, there is overlap so that one source represents current flowing on more than one wire segment. NEC2 uses an array CURX to store values of the excitation of each source.

Figure 10:
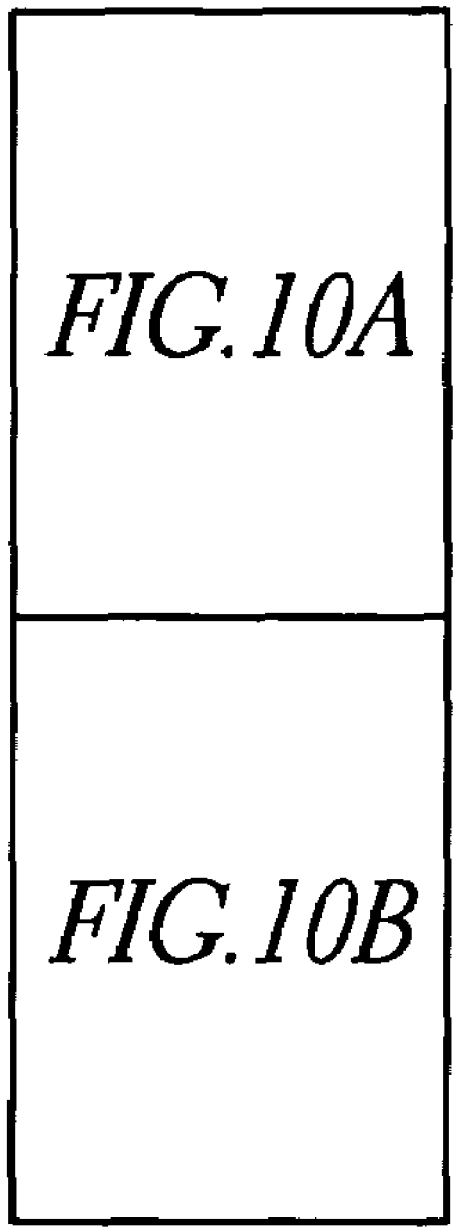
FIG. 10, consisting of FIGS. 10A and 10B, is a flowchart showing the process of generating a compressed (block sparse) impedance matrix in connection with a conventional moment-method computer program.
Figure 10A:
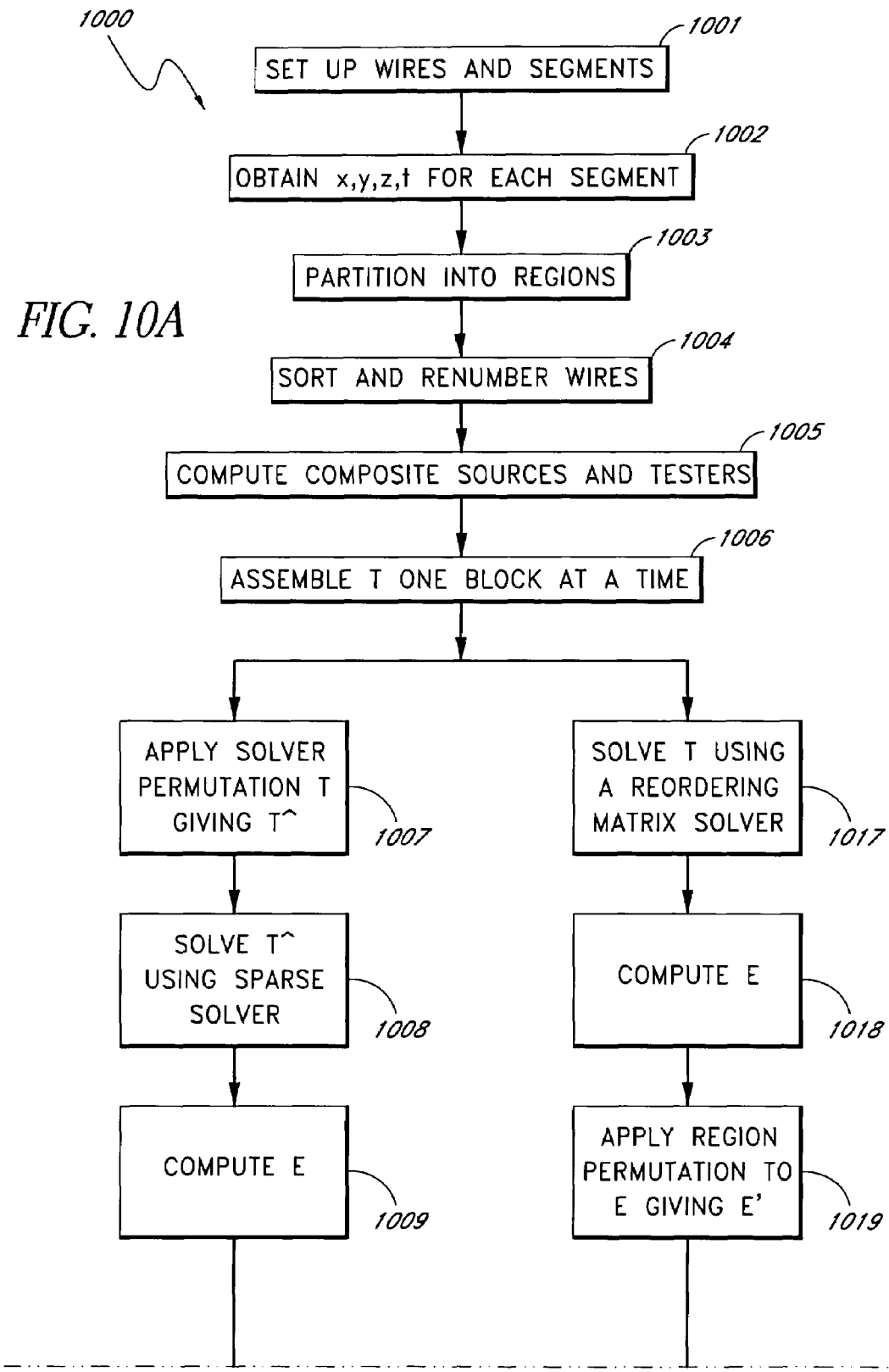
Figure 10B:
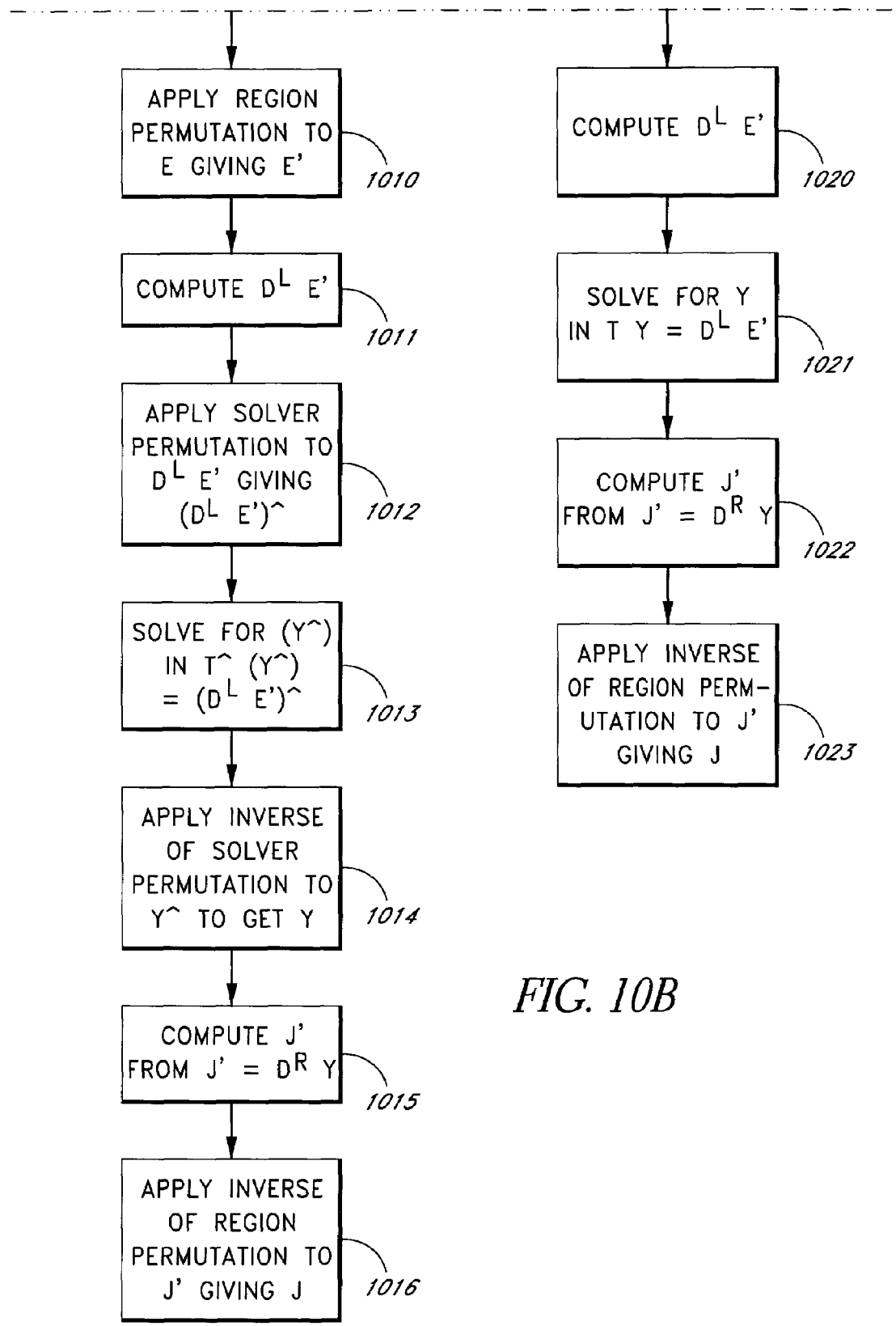

FIG. 10 is a flowchart 1000 showing the process of using NEC2 with composite sources and composite testers. The flowchart 1000 begins at a step 1001 where the NEC2 user begins, as usual, by setting up information on the grid of wires and wire segments. The process then advances to a step 1002 to obtain from NEC2 the number of wire segments, their locations (x,y,z coordinates), and a unit vector $\hat{t}$ for each segment. The vector $\hat{t}$ is tangent along the wire segment, in the direction of the electric current flow on the wire segment.

Next, in a step 1003, the wire grid is partitioned into numbered regions. A number of reference points are chosen. The reference points are roughly equally spaced over the volume occupied by the wire grid. Each wire segment is closest to one of these reference points, and the segment is considered to be in the region defined by the closest reference point. In one embodiment, the number of such points (and associated regions) is chosen as the integer closest to the square root of N (where N is the total number of segments). This is often an effective choice, although the optimum number of points (and associated regions) depends on many factors, and thus other values can also be used. For a set of N segments, each wire segment has an index, running from 1 to N.

After the step 1003, the process advances to a step 1004 where the wires are sorted by region number. After sorting, the numbering of the wires is different from the numbering used by NEC2. Mapping between the two numbering systems is stored in a permutation table that translates between these different indexes for the wire segments. Using this new numbering of segments, an array "a" is created, such that a(p) is the index of the last wire segment of the $p^{th}$ region (define a(0)=0 for convenience).

After renumbering, the process advances to a step 1005 where composite sources and composite testers for all regions are calculated. Source region p corresponds to unknowns a(p-1)+1 through a(p) in the ordering. Define M as M=a(p)-a(p-1). Choose M directions substantially equally spaced throughout three-dimensional space. In other words, place M roughly equally spaced points on a sphere, and then consider the M directions from the center of the sphere to each point. The order of the directions is unimportant. One convenient method for choosing these points is similar to choosing points on the earth. For example, choose the North and South poles as points. A number of latitudes are used for the rest of the points. For each chosen latitude, choose points equally spaced at a number of longitudes. This is done so that the distance along the earth between points along a latitude is approximately the same as the distance between the latitude lines holding the points. It is desirable that the points are equally spaced. However, even fairly large deviations from equal spacing are tolerable.

Now generate a matrix A of complex numbers with 2M rows and M columns. For m=1 to M and for n=1 to M., compute elements of this matrix two at a time: the element at row m and column n and also the element at row m+M and column n. To compute these two elements, first fill the NEC2 array CURX with zero in every position. Then, set position a(p-1)+n of CURX to unity. A value of unity indicates that only source number a(p-1)+n is excited. This source is associated with the wire segment of that number, even though it extends onto neighboring segments. The matrix Z is defined in terms of these same sources. Then, call the NEC2 subroutine CABC (CURX). The subroutine CABC generates a different representation of the source, but the same representation that the NEC2 subroutine FFLD uses. This representation is automatically stored within NEC2. The $m^{th}$ direction previously chosen can be described in spherical coordinates by the pair of numbers (Theta, Phi). After calculating Theta and Phi, the NEC2 subroutine FFLD (Theta, Phi, ETH, EPH) is called. Theta and Phi are inputs, as are the results from CABC. The outputs from FFLD are the complex numbers ETH and EPH. ETH and EPH are proportional to the strengths of the electric field in the far-field (far away from the source) in the theta and phi directions respectively. ETH is placed in row m and column n, (m,n), of A. EPH is placed at row m+M and column n of A. Alternatively, there are other ways to compute the numbers ETH and EPH produced by FFLD. For example, it will apparent to one of ordinary skill in the art that the subroutine FFLD can be modified to produce an answer more quickly by making use of the special form of the current, since most of the entries in the current are zero.

Next, a singular value decomposition of A is performed, such that:

$$A = U D V^h$$

where U and V are unitary matrices, and D is a diagonal matrix. The matrix U will not be used, so one can save on computer operations by not actually calculating U. The matrix V has M rows and M columns. Since these calculations are performed for the $p^{th}$ region, the square matrix $d_p^R$ is defined by $$d_p^R = V$$

The reason for this choice comes from the fact that $$AV = UD$$

and that each successive columns of the product UD tends to become smaller in magnitude. They become smaller because U is unitary and the singular values on the diagonal of D decrease going down the diagonal.

Figure 7:
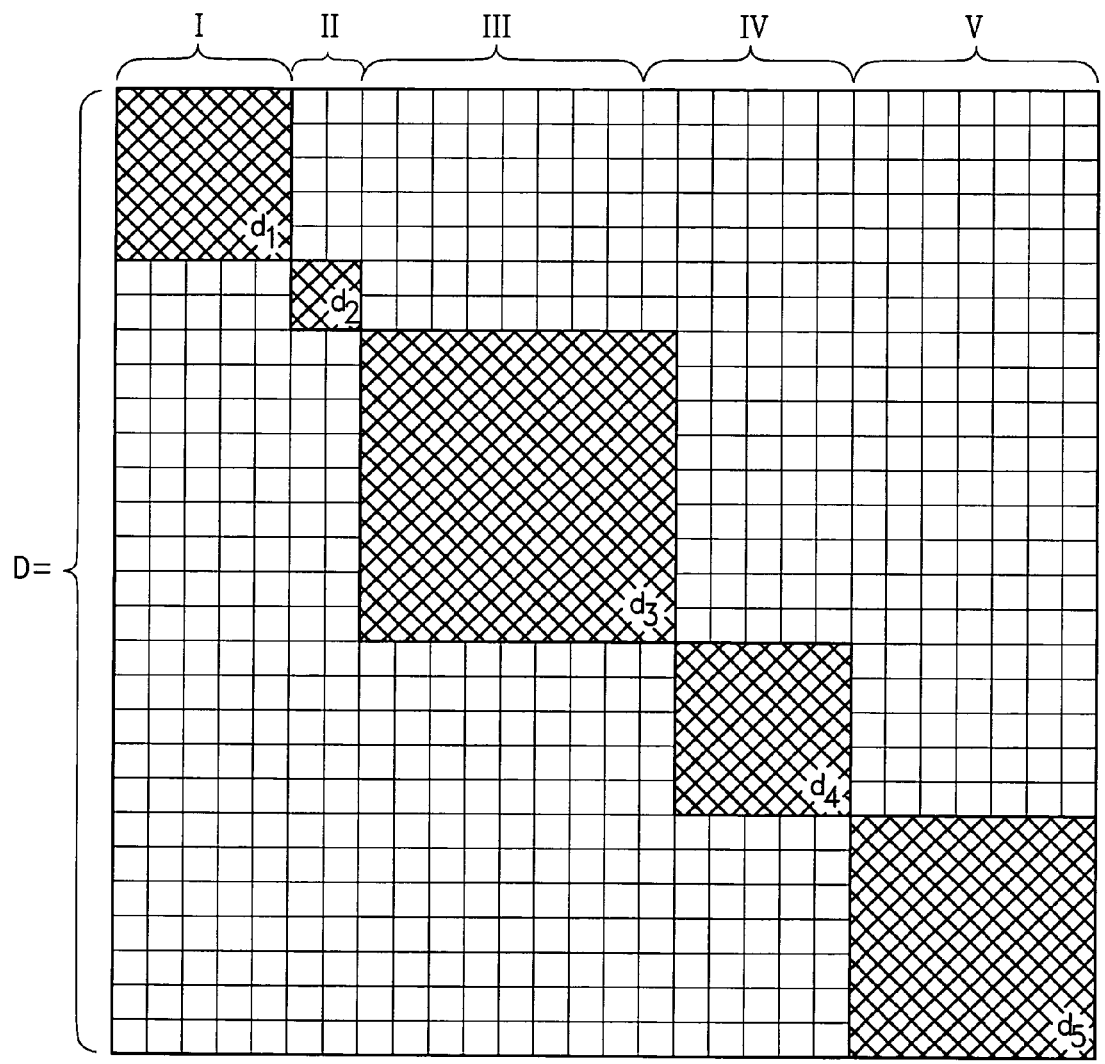
FIG. 7 illustrates the block diagonal matrix $D^R$.

Next, assemble an N by N block diagonal matrix $D^R$. That is, along the diagonal the first block corresponds to p=1. Starting at the bottom right corner of that block, attach the block for p=2, etc., as shown in FIG. 7.

Next a similar procedure is followed to find the block diagonal matrix $D^L$. For each region p, a matrix A is filled as before. However, this time this region is considered as receiving rather than as transmitting. Again A will have 2M rows and M columns, where M=a(p)-a(p-1). Again there are M directions, but now those are considered to be the receiving directions.

To understand what is to be put into A, it is instructive to note how the NEC2 computer program defines the interaction matrix Z. When used with wire grid models, the sources radiate electric and magnetic fields. However, it is the electric field reaching another segment that is used in NEC2. Each matrix element of Z is computed by computing the component of that electric field which is in the direction of the tangent to the wire segment.

For the pair of numbers (m,n), where m=1, ..., M and n=1, ..., M, the matrix entries for A at (m,n) and (m+M,n) are calculated as follows. Compute a unit vector $\bar{k}$ in the $m^{th}$ direction. Find the unit vector tangent to segment number n, and call it $\hat{t}$. The position of the center of wire segment number n is found and is designated as the vector X. Then compute the vector $$\bar{f}=(\hat{t}-(\bar{k}\cdot\hat{t})\bar{k})e^{j2\pi\bar{k}\cdot\bar{X}/\lambda}$$

where the wavelength is given by $\lambda$ (NEC2 uses units where $\lambda=1$).

Note that the Green's function for this problem has a minus sign in the exponential, and the foregoing expression does not. This is because the direction of $\bar{k}$ is outward, which is opposite to the direction of propagation of the radiation.

For problems in electromagnetics, the physical wavelength $\lambda$ is greater than zero. If a problem in electrostatics is being solved instead, electrostatics can be considered as the limit when the wavelength becomes arbitrarily large. The complex exponential above can then be replaced by unity. Also, for electrostatics, the relevant field quantity can be longitudinal (meaning f would be parallel to $\bar{k}$).

For this value of m (and associated direction $\bar{k}$), spherical coordinates define two directions called the theta and the phi directions. These directions are both perpendicular to the direction of $\bar{k}$. Compute the components of f in each of these directions, and designate them as fTheta and fPhi. These are complex numbers. Then place fTheta in row m and column n of A and place fPhi in row m+M and column n of A.

The matrix A is a matrix of complex numbers. Take the complex conjugate of A, (A*), and perform a singular value decomposition on it, such that:

$$A^*=U\,D\,V^h$$

Now define the left diagonal block for region p, $d_p^L$, as $$d_p^L=V^h$$

The superscript h on V, indicates Hermitian conjugate. The definition of the blocks for the right side did not have this Hermitian conjugate. From these diagonal blocks, assemble an N by N matrix $D^L$ similar to the way $D^R$ is assembled. The motivation for these choices is partly that the matrix $DU^h$ has rows that tend to become smaller. Further, it is expected that the Green's function used in creating Z has properties similar to the far-field form used in creating $A^t$. The formula $$V^h\,A^t=D\,U^h$$

shows that $V^h\,A^t$ will also have successive rows that tend to become smaller. The choices described above suggest that successive rows of each block of the compressed matrix will also have that property.

It should be noted that the matrix A, whether used for the right side or for the left side, can be filled in other ways as well. For example, with an appropriate (consecutive in space) ordering of the angles, A can be made as an M by M matrix by using theta polarization (fTheta) values for one angle and phi polarization values (fPhi) for the next. Usually, it is desirable that A does not leave large gaps in angle for any component of the electric field, which is important far from the source or receiver.

Figure 8:
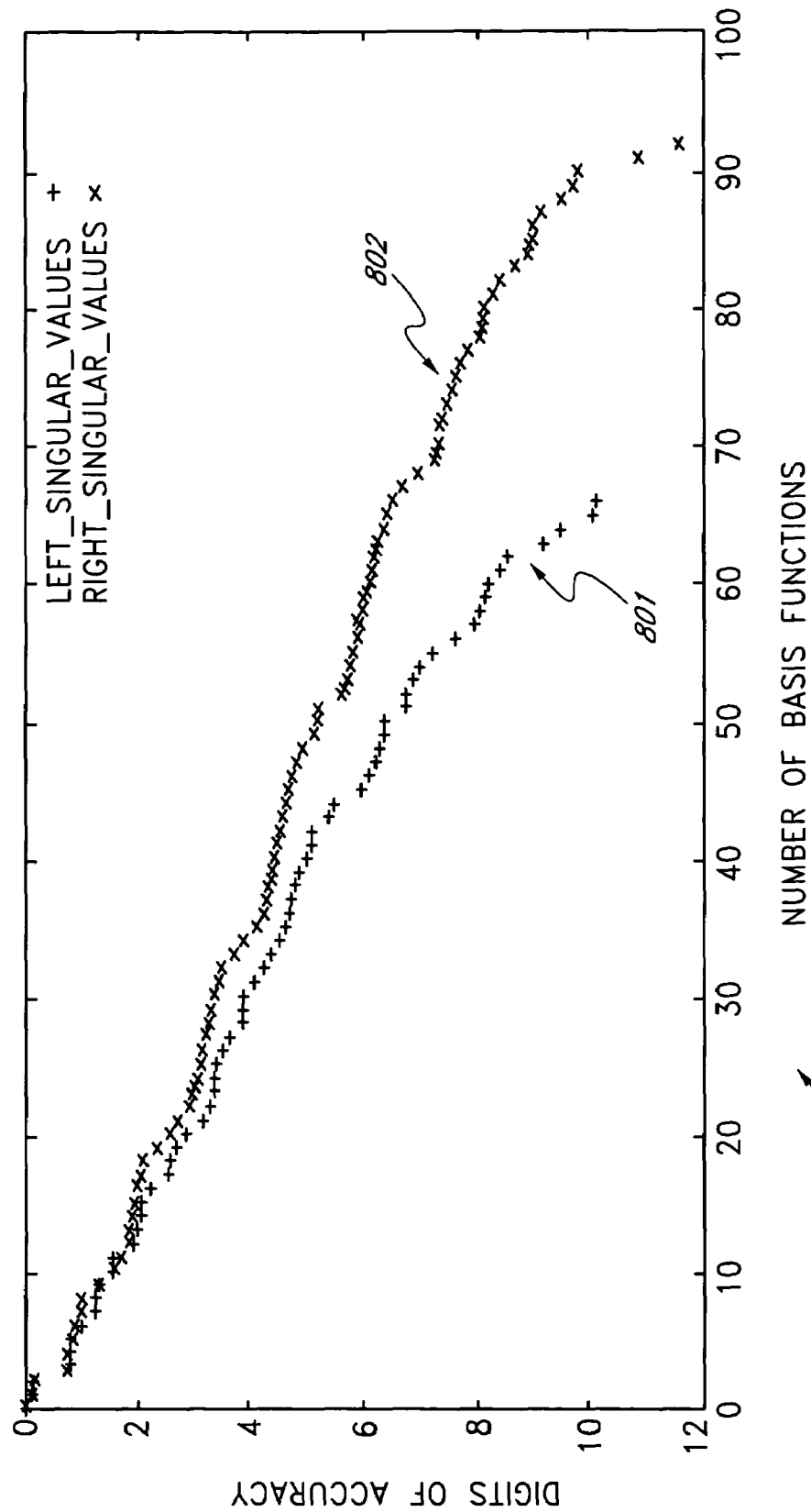
FIG. 8 is a plot showing the digits of accuracy obtained after truncating the basis functions for a block of the entire interaction matrix, with a block size of 67 by 93.
Figure 9:
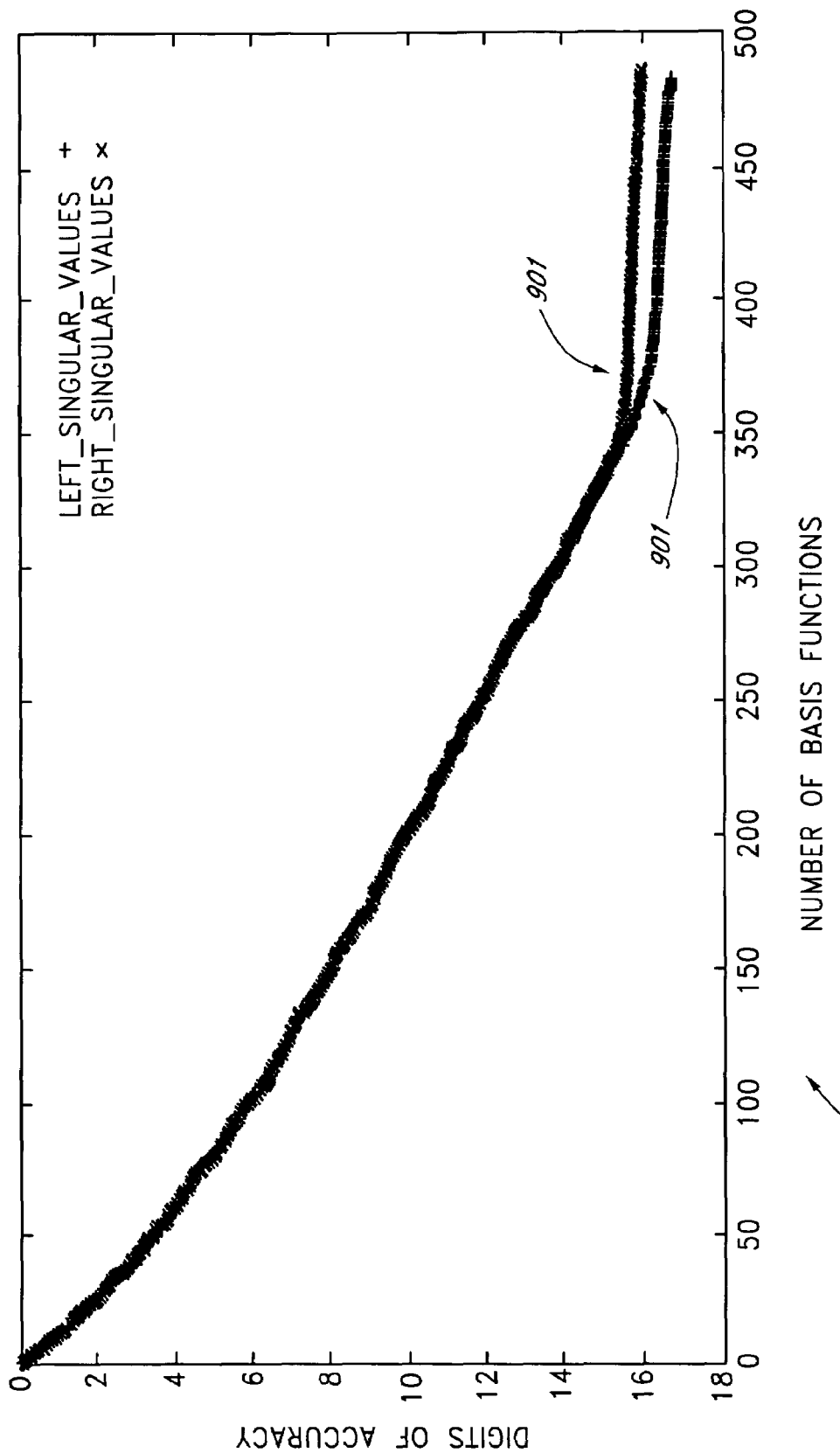
FIG. 9 is a plot showing the digits of accuracy obtained after truncating the basis functions for a block of the entire interaction matrix, with a block size of 483 by 487.

In performing the singular value decompositions for the right and left sides, singular values are found each time. FIGS. 8 and 9 show the singular values found for blocks of size 67 by 93 and 483 by 487, respectively. These calculations were done for a wire grid model with NEC2. The singular values are plotted in terms of how many orders of magnitude they are smaller than the largest singular value, and this is called "Digits of Accuracy" on the plots. FIGS. 8 and 9 show the accuracy that is achieved when truncating to a smaller number of composite sources or composite testers for regions that are relatively far apart. For regions that are closer together, the desired accuracy often requires the information from more composite sources and composite testers to be kept.

After computing composite sources and composite testers, the process advances to a step 1006 where a new matrix T, which uses the composite sources and testers associated with $D^L$ and $D^R$, is computed. The matrix is T given by the equation $$T=D^L\,Z\,D^R$$

T can be efficiently generated by using the numbering of the wire segments developed herein (rather than the numbering used in NEC2). The matrix Z is computed by NEC2 and renumbered to use the numbering described herein. Note that a block structure has been overlaid on Z and T. This block structure follows from the choice of regions. FIG. 4 shows one example of a block structure. Block {p,q} of the matrix T, to be called T{p,q}, is the part of T for the rows in region number p and the columns in region number q. The formula for T given above is such that T{p,q} only depends on Z{p,q}. Thus, only one block of Z at a time needs to be stored.

In the step 1006, T is assembled one block at a time. For each block of T, first obtain from NEC2 the corresponding block of Z. The wire segments within a block are numbered consecutively herein (NEC2 numbers them differently). Thus, first renumber Z using the renumber mapping from step 1004, and then perform the calculation:

$$T\{p,q\}=d_p^L Z\{p,q\}d_q^R$$

Many of the numbers in T{p,q} will be relatively small. An appropriate rule based on a desired accuracy is used to choose which ones can be approximated by zero. The remaining non-zero numbers are stored. Storage associated with the zero-valued elements of T{p,q} and of Z{p,q} can be released before the next block is calculated. The top left portion of T{p,q} has matrix elements which will be kept. Anticipating this, the calculation speed can be increased by not calculating either the right portion or the bottom portion of T{p,q}.

The matrix T is a sparse matrix, and it can be stored using an appropriate data structure for a sparse matrix. For a matrix with $N_z$ non-zero elements, an array $Z_z(i)$ for $i=1, \ldots, N_z$, can be used, where $Z_z(i)$ is the complex value of the $i^{th}$ matrix element. There are two integer valued arrays, $I_z(i)$ and $J_z(i)$ for $i=1, \ldots, N_z$. $I_z(i)$ gives the row number where the $i^{th}$ matrix element occurs in T and $J_z(i)$ its column number.

After calculation of T, the process proceeds to a process block 1007 where the rows and columns of the matrix T are reordered to produce a matrix T^. The matrix T is reordered into a matrix T^ so that the top left corner of every block of T^ ends up in the bottom right corner of the whole matrix. The T^ form is more amenable to LU factorization. FIG. 5 shows an example of a matrix T, and FIG. 6 shows an example of a matrix T^ after reordering. One embodiment uses a solver that has its own reordering algorithms thus negating the need for an explicit reordering from T to T^.

After reordering, the process advances to a step 1008 where the matrix T^ is passed to a sparse matrix solver, such as, for example, the computer program "Sparse," from the Electrical Engineering Department of University of California at Berkeley. The program Sparse can be used to factor the matrix T^ into a sparse LU decomposition.

NEC2 solves the equation $$J=Z^{-1}\,E$$

for various vectors E. In FIG. 10, the solution of the above matrix equation is done in steps 1009-1016 or, alternatively, in steps 1017-1023. The sequence of steps 1009-1016 is used with a matrix equation solver that does not provide reordering. The sequence of steps 1017-1023 is used with a matrix equation solver that does provide reordering.

In the step 1009, the vector E is computed by NEC2. Then, in the step 1010, the elements of E are permutated (using the same permutation as that used in the step 1004) to produce a vector E'. This permutation is called the region permutation. Next, in the step 1011, E' is expressed in terms of composite testers by multiplying E' by $D^L$, giving $D^L E'$. Then, in the step 1012, the same permutation used in the step 1007 is applied to $D^L E'$ to yield $(D^L E')\hat{}$. (This permutation is called the solver permutation.) Then, in the step 1013, a matrix equation solver (such as, for example, the solver known as "SPARSE") is used to solve for the vector $Y\hat{}$ from the equation $$T\hat{}(Y\hat{}) = (D^L E')\hat{}$$

Then, in the step 1014, the inverse of the solver permutation is applied to $Y\hat{}$ to yield Y. In the subsequent step 1015, J' is computed from the equation $$J' = D^R Y$$

In the subsequent, and final, step 1016, the inverse of the region permutation is applied to J' to yield the desired answer J.

Alternatively, the embodiment shown in steps 1017-1023 is conveniently used when the matrix equation solver provides its own reordering algorithms, thus eliminating the need to reorder from T to $T\hat{}$ (as is done in the step 1007 above). In the step 1017, a reordering matrix solver is used to solve the matrix T. In the subsequent step 1018, the vector E is computed by NEC2. Then, in the step 1019, the elements of E are permutated using the region permutation to produce a vector E'. Then, in the step 1020, $D^L E'$ is computed. The process then proceeds to the step 1021 where the equation $$TY = D^L E'$$

is solved for Y. After Y is computed, the process advances to the step 1022 where J' is calculated from the equation $$J' = D^R Y$$

Finally, in the step 1023, the inverse of the region permutation is applied to J' to yield the desired answer J.

Figure 11:
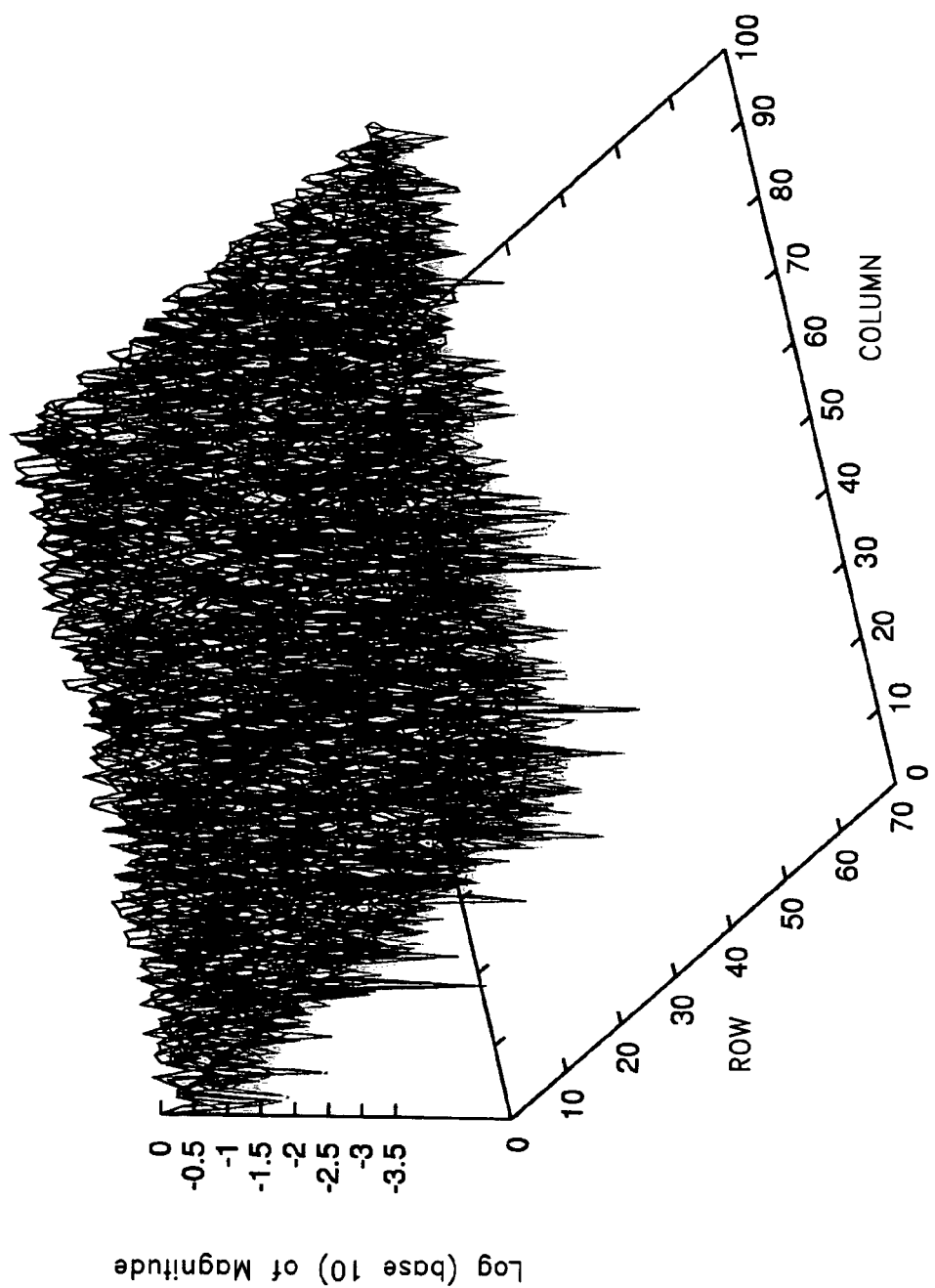
FIG. 11 is a three-dimensional plot showing magnitudes of the entries in a 67 by 93 element block of the interaction matrix (before transformation) for a wire grid model using the method of moments.
Figure 12:
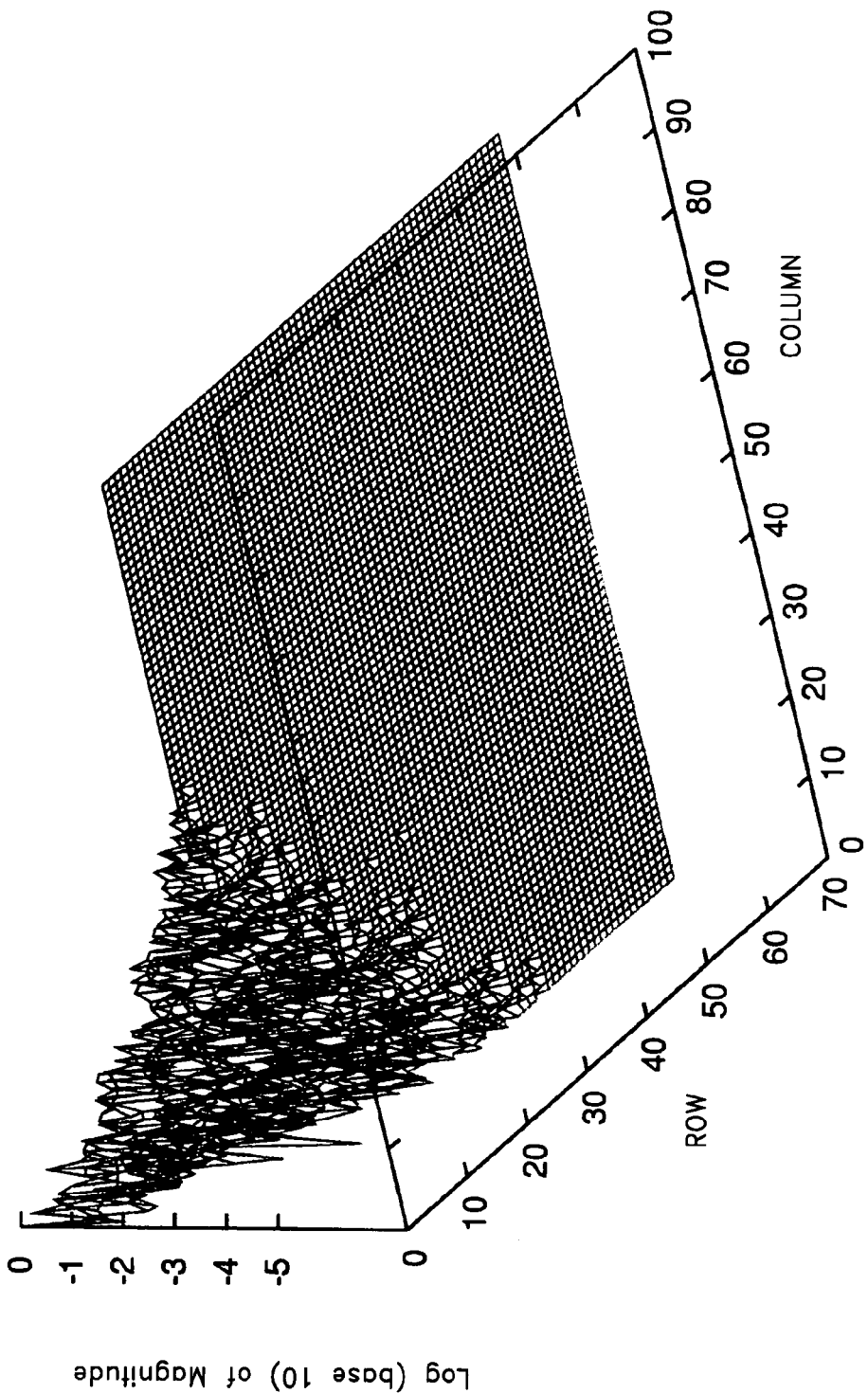
FIG. 12 is a three-dimensional plot showing magnitudes of the entries of the interaction matrix from FIG. 11 after transformation.

Many matrix elements are made small by this method. FIGS. 11 and 12 show before and after results for a problem using a wire grid model in NEC2, with a matrix Z of size 2022 by 2022 and a block of size 67 by 93. FIG. 11 shows the magnitudes of the matrix elements before changing the sources and testers, meaning it shows a 67 by 93 block of the renumbered Z. FIG. 12 shows this same block of T. The matrix T has a regular structure wherein the large elements are in the top left corner. This is a general property of the transformed matrix. For larger blocks, the relative number of small matrix elements is even better.

The algorithms expressed by the flowchart shown in FIG. 2 can be implemented in software and loaded into a computer memory attached to a computer processor to calculate, for example, propagation of energy, pressure, vibration, electric fields, magnetic fields, strong nuclear forces, weak nuclear forces, etc. Similarly, the algorithms expressed by the flowchart shown in FIG. 10 can be implemented in software and loaded into a computer memory attached to a computer processor to calculate, for example, electromagnetic radiation by an antenna, electromagnetic scattering, antenna properties, etc.

Although the foregoing has been a description and illustration of specific embodiments of the invention, various modifications and changes can be made thereto by persons skilled in the art without departing from the scope and spirit of the invention. For example, in addition to electromagnetic fields, the techniques described above can also be used to compress interaction data for physical disturbances involving a heat flux, an electric field, a magnetic field, a vector potential, a pressure field, a sound wave, a particle flux, a weak nuclear force, a strong nuclear force, a gravity force, etc. The techniques described above can also be used for lattice gauge calculations, economic forecasting, state space reconstruction, and image processing (e.g., image formation for synthetic aperture radar, medical, or sonar images). Accordingly, the invention is limited only by the claims that follow.

Directional Sources and/or Testers

The above disclosure describes compression of interaction data, hereinafter called the Basic Method. The interaction data describes the physical effect of a source, that physical effect being evaluated by a tester. Typically, the evaluation by a tester gives a numerical value for this physical effect. The Basic Method involves a transformation that gives new sources. Typically, a relatively small number of these new sources produce a relatively strong effect at distant locations. Most of these new sources typically produce a weak effect at distant locations. The Basic Method includes transforming the testers to give new testers so that only a relatively small number of the new testers receive strongly from distant sources. This permits compression of a matrix of interaction data. One advantage of the Basic is that it is simple to apply to complicated problems.

Embodiments using directional sources and/or testers typically increase the compression even further. Sources that create a strong effect at some (or all) distant locations will be called propagating modes. Sources that create a relatively weak effect at substantially all distant locations will be called non-propagating modes. In the Basic Method, the number of propagating modes is relatively small as compared to the number of non-propagating modes.

The non-propagating modes generally are associated with relatively smaller matrix elements. That is, a non-propagating mode interacts so weakly at a distance that the interaction data associated with it will contain relatively many small numbers. Many of these numbers can often be approximated by zero.

The propagating modes created according to the Basic Method generally produce a relatively large effect for distant locations in many directions, possibly even in most or all directions. This large effect can result in the interaction data containing large numbers for many of the elements of the interaction data associated with these propagating modes. Thus, even though the number of propagating modes has been reduced, the propagating modes that remain can limit the amount of data compression achieved.

The above disclosure includes an example of how to modify the popular program NEC2 to separate the propagating and the non-propagating modes. FIG. 12 plots the magnitudes of the resulting matrix elements. These matrix elements describe the effect of a source, as tested by a tester. The magnitudes of these matrix elements for one source region interacting with one testing region are plotted on a logarithmic scale. The larger numbers in the upper left corner of FIG. 12 are associated with sources which are strongly propagating and with testers which also are strongly propagating. In FIG. 12, the leftmost columns are associated with sources which are strongly propagating and the rightmost columns are associated with sources which are typically not strongly propagating or even non-propagating.

In one embodiment, it is useful to choose a column, and define everything to the left of the chosen column as propagating, and to define everything either on the chosen column or to the right of the chosen column as non-propagating. The column chosen depends on the desired strength of propagation of a mode necessary for it to be considered propagating. The definition can also vary somewhat depending on the accuracy desired. Although this is somewhat arbitrary, the effectiveness of the result achieved often depends only weakly on this choice. For example, the Basic Method describes a permutation of the columns of the overall matrix of interaction values, according to whether a column is associated with propagating or non-propagating modes. The compression achieved by a compressed LU factorization is found to be very weakly dependent on this choice. The terms propagating and non-propagating can also be used for other purposes, such as is done below. The exact numerical value for where the line is drawn between these types of modes can be different from that used when permuting the columns of the matrix in the Basic Method.

For an illustrative example of how to create directional propagating modes, the sources similar to those used in FIG. 12 are created from the sources from NEC2. Then, a further transformation is made which only effects the propagating modes. The non-propagating modes are not changed, so that the right hand part of a plot corresponding to that of FIG. 12 is not affected. The goal is to create small matrix elements within the area corresponding to the large numbers in the upper left portion of FIG. 12. Similarly, the testers corresponding to the upper portion of a plot such as that of FIG. 12 can also be transformed.

It is well known in the antenna art that an antenna much smaller than a wavelength cannot produce narrow beams. This is a consequence of the Fourier transform and applies to most physical systems that have wave or wave-like properties. Thus, one expects that a physical region that can support directional propagating modes will not have a characteristic size much smaller than a wavelength. Typically, it will have a characteristic size either similar to the size of a wavelength or larger than a wavelength. For example, the characteristic size will often be larger than one half a wavelength. In other cases, this invention can be applied to problems where there is no wavelength. Often, the physical dimensions of a physical object will supply the relevant length scale.

The directional modes are not limited to systems with wave phenomena. For example, directional modes can be applied to electrostatic phenomena where there is no wavelength. For such problems, it is still possible to produce a directional effect. Some well-known examples of sources which produce such an effect are dipoles and quadrapoles. For such problems, the physically achievable beams are used in conjunction with the directions of interest for that problem, just as they are in the electromagnetic example.

Figure 13:
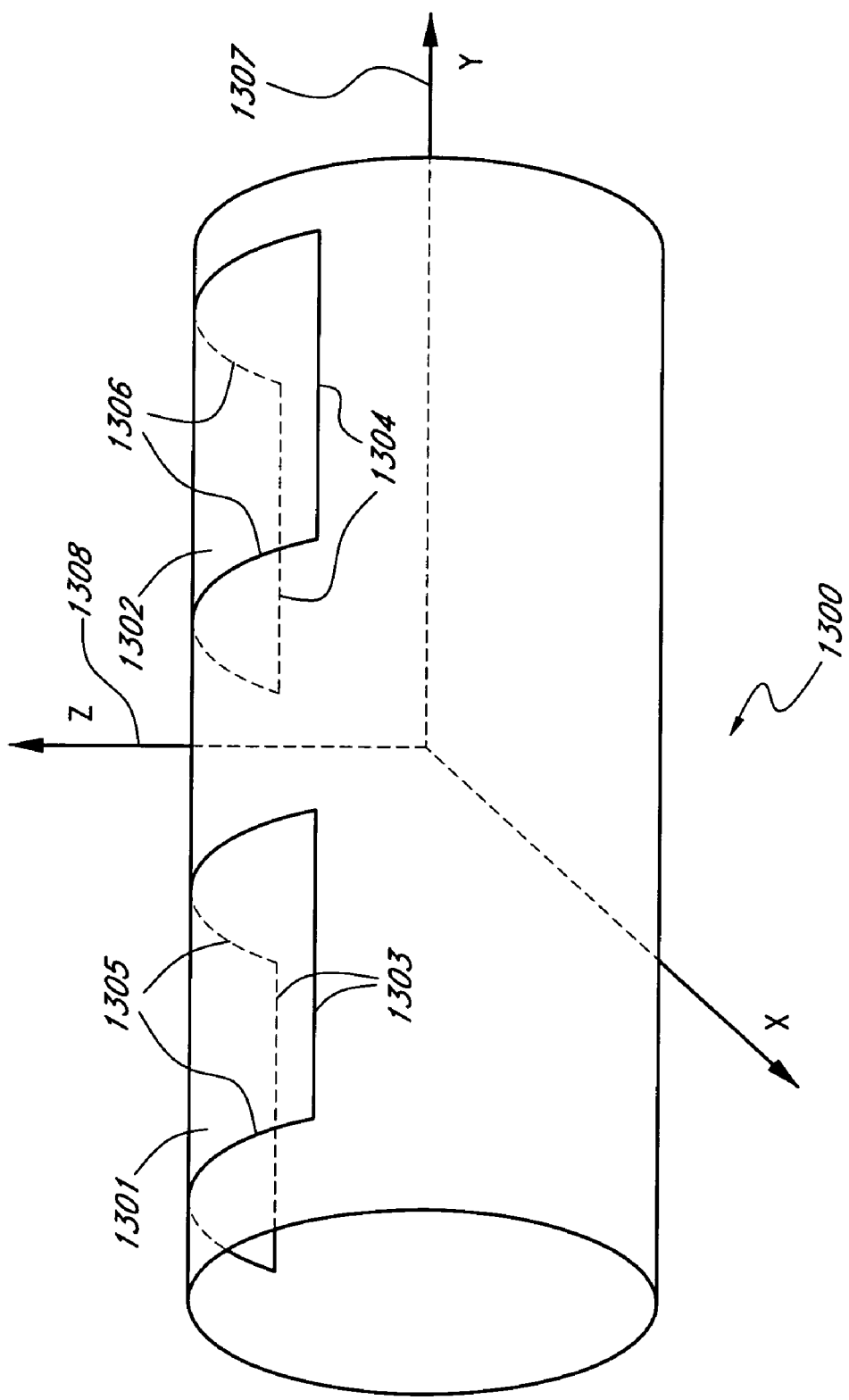
FIG. 13 shows a circular cylinder with a source region and a testing region defined on it.

As a physical test problem, consider a circular cylinder, with a circumference of thirty-two wavelengths and a length of twenty wavelengths, as shown in FIG. 13. Two physical regions, 1301 and 1302, are chosen on this surface. Each region is six and a fifth wavelengths long on each side, and can be thought of as a square surface that has been bent to fit on this cylinder. Two sides 1303 of a first region 1301 and two sides 1304 of a second region 1302 are directed parallel to the axis of the cylinder. Two sides 1305 of the first region 1301 and two sides 1306 of the second region 1302 are perpendicular to the axis of the cylinder. The y-axis 1307 of a right-handed coordinate system coincides with the axis of the cylinder. Each region is, in an average sense, perpendicular to the z-axis 1308, which can be thought of as the vertical direction. Both regions are on the upper portion of the cylinder.

In order to use NEC2, each region is modeled by a wire mesh with five straight wire segments per wavelength. Such a wire mesh model is well known to those familiar with NEC2. Thus, on each region wires can point in each of two directions on a 31 by 31 grid, for 1922 wire segments on each region. These two regions differ from each other by a displacement of twelve wavelengths along the direction of the axis of the cylinder.

Next, 1922 angular directions are chosen, so that they are approximately equally spaced throughout three-dimensional space. This is done as described in the Basic Method. If each angular direction is represented by a vector of length one, then each angular direction can also be represented as a point on a sphere of radius one. One could equivalently say it is desired that these points be approximately equally spaced on the surface of the sphere. Next, it is desired that these 1922 angular directions be grouped into groups of angular directions. To do so, as a preliminary step 22 region directions are chosen that are approximately equally spaced. In spherical coordinates, each of these 22 region directions can be described by two angles, theta and phi. Theta describes the angle in degrees from the z-axis and phi is the angle from the x-axis.

These 22 region directions are chosen as eight unpaired region directions, and seven pairs of region directions, as shown in Table I.

TABLE I

| Region Direction # | Theta | Phi | | |
|---|---|---|---|---|
| 1 | 90 | 0 | | |
| 2 | 90 | 45 | | |
| 3 | 90 | 90 | | |
| 4 | 90 | 135 | | |
| 5 | 90 | 180 | | |
| 6 | 90 | 225 | | |
| 7 | 90 | 270 | | |
| 8 | 90 | 315 | | |
| Region Pair # | Theta | Phi | Theta | Phi |
| 9 | 0 | 0 | 180 | 0 |
| 10 | 45 | 0 | 135 | 0 |
| 11 | 45 | 60 | 135 | 60 |
| 12 | 45 | 120 | 135 | 120 |
| 13 | 45 | 180 | 135 | 180 |
| 14 | 45 | 240 | 135 | 240 |
| 15 | 45 | 300 | 135 | 300 |

These 22 region directions are approximately equally spaced. While equal spacing is generally advantageous, the method described here will also work when there are large deviations from equal spacing.

Next, each of the 1922 angular directions is associated with one region direction. This results in 22 angular regions. This is accomplished by first letting each angular direction be associated with a point on a sphere of radius one, and by letting each region direction be associated with a point on a sphere of radius one. These points are called angle points and region points respectively. Each of these points is defined as the point on a sphere of radius one centered at the origin that is intersected by a vector from the origin in the corresponding direction.

For each angle point, the distance is computed to each of the region points. The angle point is chosen to be in the region associated with the region point that gives the smallest distance. In case of ties, one of the closest region points can be arbitrarily chosen. This gives 22 angular regions. Then, some pairs of angular regions are combined. The two angular regions associated with region pair number 9 are combined with each other, those associated with region pair number 10 are combined with each other, and so on, until those associated with region pair number 15 are combined. Now there are 15 angular regions.

The reason for combining these angular regions is physically based. The particular computer program being used for the present example is NEC2. It is desired to compress the matrices produced by NEC2. The physical sources in NEC2 are wire segments. NEC2 uses an electric current on each wire segment. It is well known to those skilled in the art that such a current on a thin wire radiates equally on one side of a wire and on the other side. Each of the 1922 wire segments is oriented approximately parallel to the x-y plane. Thus, each wire segment will radiate approximately equally in the two directions (x,y,z) and (x,y,−z) for any values of x, y, and z. Notice that the seven region pairs represent pairs of directions, where if one is given by (x,y,z) for some values of x, y, and z then the other is given by (x,y,−z).

For any of these fifteen angular regions, it is physically achievable to produce an electric current, on the wire segments, that radiates an electric field that is substantially contained within that angular region. For the original 22 angular regions, by using only strongly propagating modes, this would not be possible (even though it can well be possible using all modes). In general, an electric current that causes a substantial radiation to one member of the seven region pairs will generally also cause a substantial radiation into the angular region of the other member of that pair.

As mentioned above, this embodiment begins by using an embodiment the Basic Method (which used the Singular Value Decomposition). That embodiment transforms modes into a generally smaller number of propagating modes and a number of non-propagating modes. These propagating modes are called strongly propagating modes. From these strongly propagating modes, it is desired to create modes that have nearly all of their effect within some angular region. In one embodiment, two steps are used to accomplish this. First, the angular region is chosen to be physically achievable using strongly propagating modes. Second, for each angular region find the combinations of modes which radiate within this region as effectively as possible. That is, find the modes that produced the strongest effect possible for distant locations within this angular region.

The Basic Method, according to an embodiment using NEC2 described above, a transformation is applied to the physical sources in a region modeled using 93 wire segments and is applied to testers in a testing region using 67 wire segments. The result is that the interaction data in terms of the resulting composite sources and testers is a 67 by 93 array of data elements. This interaction data is shown in FIG. 12. Here, that same transformation is applied to source and testing regions each having 1922 wire segments. The resulting interaction data form a 1922 by 1922 block of numbers. Now, the top left corner of the block is so large that it has a significant number of elements. The data in this top left corner can be further compressed by using directional propagating modes.

Analogously to an embodiment using NEC2 described above, 1922 angles are chosen, and a matrix A is computed. The chosen angles range over all angles of interest, and for the present example, that is taken to be all directions possible in three dimensions. This matrix has 3844 rows and 1922 columns. There are two rows for each angle and one column for each wire segment associated with this region. Then the singular value decomposition (SVD) of A is computed as:

$$A = U D V^h \qquad (3)$$

Previously, the matrix V was used to compute new basis functions. Here, in the directional method, V is modified according to the desired directional sources and/or testers. Then, the analysis continue as in the Basic Method using the modified V in place of the original V. This modification to V will not affect the part of V associated with non-propagating modes. It will only affect the leftmost columns of V which are associated with strongly propagating modes.

The directionalization of sources, described here as a modification to the Basic Method, is to be applied to the testers as well. Composite sources are constructed using a matrix A, which contains numbers representing the strength of the field radiated by sources. Composite testers are constructed using a (different) matrix A for the testers, containing numbers computed in a similar manner. For those skilled in the art of electromagnetic computation, it will already be clear that the principle of reciprocity relates the matrix A for sources and the matrix A for testers. It is possible to compute A for testers by performing a time reversal on the testers and then determining how they radiate. This radiation is then used as for the case of sources to produce a matrix B. That is, the numbers in B describe how the strength of the effect due to the time-reversed testers. Since B is for transmitting rather than receiving, the complex conjugate of B is then equal to A. The words "time reversal" simply mean that the direction of the motion of the current is reversed. In practice, when a frequency domain method such as NEC2 is used this is usually accomplished by taking the complex conjugate of each tester. That is, a tester is a complex number that is a function of position. The complex conjugate of this represents something moving in the opposite direction. Thus, the numbers in B in a given row and column represent the strength of the field radiated to the direction associated with that row, by a source which is equal to the complex conjugate of the tester associated with that column.

The matrix A associated with the testers can also be found by other methods as well. For example, each element of A describes how strongly the tester (associated with a column of A) receives from a direction (associated with a row of A). This way, A can be computed directly.

For some problems "all angles of interest" can not be all angles. For example, consider a problem using NEC2 for a planar structure. Then it should be clear that "all angles of interest" means all angles for directions within the plane of that structure. These are all of the angles that occur in computing the matrix of interaction data. As a further example, consider a problem having a planar structure and a small object close to that plane. In fact, when interactions between the plane and the small object are considered, all directions occur in computing matrix elements. However, it can also be true that all but a relatively small fraction of the elements of the matrix of interaction data involve directions that are approximately parallel to the plane. For the goal of compressing only this part of the matrix, all angles of interest can be only those angles parallel to this plane. It is possible that an optimum compression will occur when compression of this small fraction of the elements of the matrix is ignored.

For the physical example of FIG. 13 with two regions on a circular cylinder, this embodiment takes all angles of interest to be all angles within a three dimensional space. This is appropriate since the sources that are computed are used for other testing regions in a variety of locations. As an option which would be especially appropriate for a more restricted geometry, one can restrict "all angles of interest" to be less than all angles. This can be especially appropriate for computations from a long and slender body such as for acoustic scattering from a submarine or radar scattering from a missile. For such bodies the direction along the long axis of the body is especially interesting, while directions near perpendicular to this are of less interest. Similarly, consider a parabolic reflector, such as is used in antennas for direct broadcast television reception from satellites. Such antennas are now commonly seen on many homes. The reflecting surface is curved. Consider the group of directions between any two points on this surface. This group of directions could represent a possible choice of all directions of interest for interaction data involving this surface. This group of directions does not include all directions as it does not include any directions near perpendicular to this surface.

In several embodiments discussed in the Basic Method, the matrix U from equation (3) is not used, and it is not even necessary to explicitly compute U when using the Basic Method. For this embodiment of the new method described here, U is computed and used. When A is computed, each row is associated with an angle. In fact, each angle is associated with two rows. Since now there are fifteen angular regions, it is natural to group the rows of A into fifteen ranges of rows. Taken collectively, these fifteen ranges of rows constitute all of the rows of A. Similarly, these same fifteen ranges of rows in U are significant. This leads to using fifteen matrices, called $U^p_r$ (for r=1 to 15). Taken collectively, these fifteen matrices contain all of U. The rows are in U are assembled as rows of $U^p_r$. In addition, the order of these rows within $U^p_r$ is not important. That is, interchanging any two rows within any $U^p_r$ is allowed.

Figure 14:
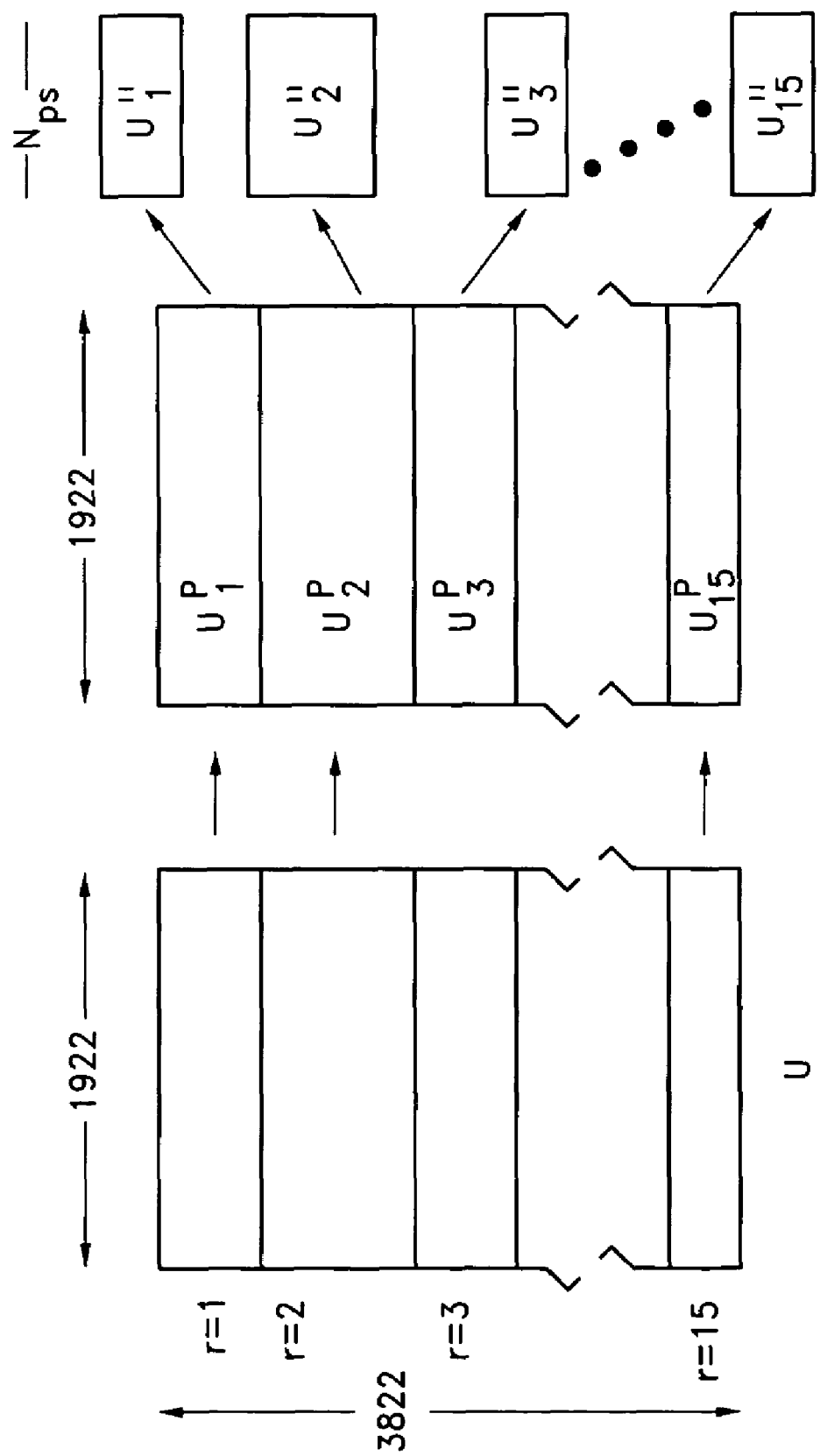
FIG. 14 shows the matrix U and how the sub matrices $U^p_r$ and $U''_r$ are selected from within U.

It is perhaps easier to visualize what is happening in the case where the rows of U associated with angular region 1 occur first, those for angular region 2 occur next, etc. In that case, the matrix $U^p_r$ is illustrated in FIG. 14. It can be seen on this figure that for each r, $U^p_r$ is simply the part of U for a certain range of rows. In more general cases, these rows can not be contiguous.

A matrix $U''_r$ can now be defined. This is made up of first Nps columns of $U^p_r$ for some number Nps. FIG. 14 shows how this is done. As before, this figure only illustrates the case where the first angular region corresponds to the first range of rows in U, etc. This does not represent a limitation on the invention. It simply corresponds to an example.

The choice of the number Nps is somewhat arbitrary. This number can be changed greatly, and the effect on the actual amount of data compression is modest. In creating directional propagating modes, it is desirable to use only strongly propagating modes. However, as more and more modes are included, it is possible to produce narrower and narrower beams of radiation but it is necessary to include modes which are propagating less and less strongly. However, if too many modes are used, thus including modes that radiate especially weakly (non-propagating modes), then beams can result which are not smooth in strength with respect to slight changes in the angular direction.

In many cases, the successive singular values, e.g. the successive diagonal elements of the matrix D (see equation (3)), decrease smoothly. This makes it all the more apparent that the exact choice of Nps is somewhat vague. In some cases, there is an abrupt decrease in the size of the singular values at some point. Often this will happen once the singular values are fairly small, so that an appropriate choice for Nps is associated with larger singular values. In that case, the exact choice for Nps is still somewhat arbitrary.

An important use can often be made of such an abrupt decrease. FIGS. 8 and 9 show singular values that decreased relatively smoothly. In FIGS. 8 and 9, the vertical axis is labeled "Digits of Accuracy." An increase of two "Digits of Accuracy" corresponds to singular values decreasing in size by two orders of magnitude, or equivalently it corresponds to a change given by a factor of $10^{-2}$=0.01. An abrupt decrease is often (but not always) as large a change as this or larger. An abrupt decrease generally can be noticed simply by looking at a graph such as in FIG. 8 or 9. It appears to the human eye simply as a decrease that appears out of place. Such an abrupt decrease is often associated with a defect in a physical model.

One common type of defect occurs when there is an underlying grid. For example, sometimes there are two points that are very close together but do not touch. In some cases (but not in others), it is intended that these two points be the same point. In many cases this leads to a numerically unstable model. Finding such problems is often labor intensive and often requires a highly trained person. There are many other instabilities which also can be identified from an abrupt decrease in the singular values. For example, sometimes the underlying basis functions (before the compression methods herein are applied) span across many grid points. Such basis functions generally overlap each other significantly. Stable numerical formulations generally result when these basis functions are designed to be linearly independent or even orthogonal or nearly orthogonal. When this is not done well, a physical model with instabilities often results. The existence and also the source of such problems can often be found by looking for an abrupt decrease in the singular values. These problems are called interaction formulation problems.

As an example, consider a grid with two points that are relatively very close together. It is possible to produce an effect radiating from each point so that these two effects add in phase or out of phase. That is, the effects can combine constructively to produce a large net effect or they can interfere destructively to produce a very small effect for all directions from these points. This very small effect is generally associated with a small singular value, one that occurs after an abrupt decrease.

Each abruptly small singular value, meaning each one after an abrupt decrease, is associated with a vector within the matrix V (see equation (3)). Such a vector gives the linear combination of the basic sources, which produces a composite source that radiates "abruptly weakly." This linear combination can be examined to find the cause of the associated numerical instability. This method has many advantages over prior art. For example, this method could, for example, compute Singular Value Decompositions (SVDs) on relatively small physical regions. Performing many small SVDs is much less "costly" (in terms of the number of computer operations required) than performing one large SVD. Also, performing separate small SVDs tends to prevent the mixing of the effects of different numerical problems, where such mixing sometimes makes identifying these problems relatively more difficult. As an alternative, other rank-revealing factorizations can be used instead of using the SVD to find abruptly-small singular values and the modes associated with them. This same method also can be used to find an abruptly-small singular value associated with testers. The term abruptly-small singular value is used for the first abruptly small singular value and for all singular values smaller than that. The associated modes are called abruptly weak modes. These modes interact weakly with distant locations, whether they represent sources or testers. They can, be determined using an SVD, a rank revealing factorization, or another method which determines the strength of their interaction with distant locations.

The choice of Nps results from a trade-off. Narrow beams, produced by a larger Nps, are desirable. Excluding non-propagating modes is desirable, making a smaller Nps desirable. In order for there to be one value of Nps which simultaneously satisfies both conditions, it is generally desirable to weaken the "narrow beams" condition. By choosing to combine the angles into angular regions, the angular range of one angular region is made relatively large. In the example above, the angular range corresponding to one of 15 angular regions is much larger than the angular range corresponding to one of 1922 angles. By using angular regions a larger beam width is acceptable, Nps does not need to be as large, and this facilitates finding a value for Nps that satisfies both of these conflicting requirements.

The choice of the best number of angular regions depends on many factors. However, it is possible to find an estimate, which if desired can be used as an initial value to try. For wave phenomena it is well known to those skilled in antenna design that the beam width attainable by an antenna depends on its size in wavelengths. As a rough rule of thumb, an antenna can produce a beam width (given in units of radians) approximately equal to one over the size of the antenna in units of wavelengths. There are ways to get around this general rule, such as by using "supergain" concepts. However, such methods typically use a significant number of non-propagating modes. For the present physical problem the regions 1301 and 1302 in FIG. 13 are approximately six by six wavelengths in size. Thus, a typical antenna beam would occupy one thirty-sixth of a square radian, compared to four pie radians for all directions. To make the overlap weak, only 15 angular regions are used for this embodiment. Note that 15 is much smaller than $144\pi$, which is a reasonable estimate of the number of beams possible (a more careful estimate can be somewhat smaller than $144\pi$, but it would still be significantly larger than 15). Angular regions that are large enough to contain a number of beams that only weakly overlap (if at all) are called beam-groupable regions. Other values for the number of angular regions can also be used, especially other values that are small enough so that beam-groupable regions are still used.

It is also necessary to choose Nps. The strength of the effect that a mode produces far away is proportional to the associated singular value. That is, in equation (3) there is a diagonal matrix D, and the elements on the diagonal are the singular values. The non-negligible matrix elements as in FIG. 12 are generally associated with singular values of size 0.001 to 1.0. This occurs because in the example of FIG. 12, "negligible" is defined as smaller by five orders of magnitude. For other problems this tolerance will be different, either larger or smaller. Thus, for FIG. 12, Nps is chosen to be the number of modes with singular values between 1 to 0.001. This turns out to be 498 out of 1922 for the sources and 569 out of 1922 for the testers for this problem. Computations have also been performed using other ranges, such as 0.01 to 1.0 and 0.0001 to 1.0. The amount of data compression achieved with those ranges is only slightly different than with the range 0.001 to 1.0. As an option, several such ranges can be tried to determine which gives the optimum data compression for a given problem.

Figure 15:
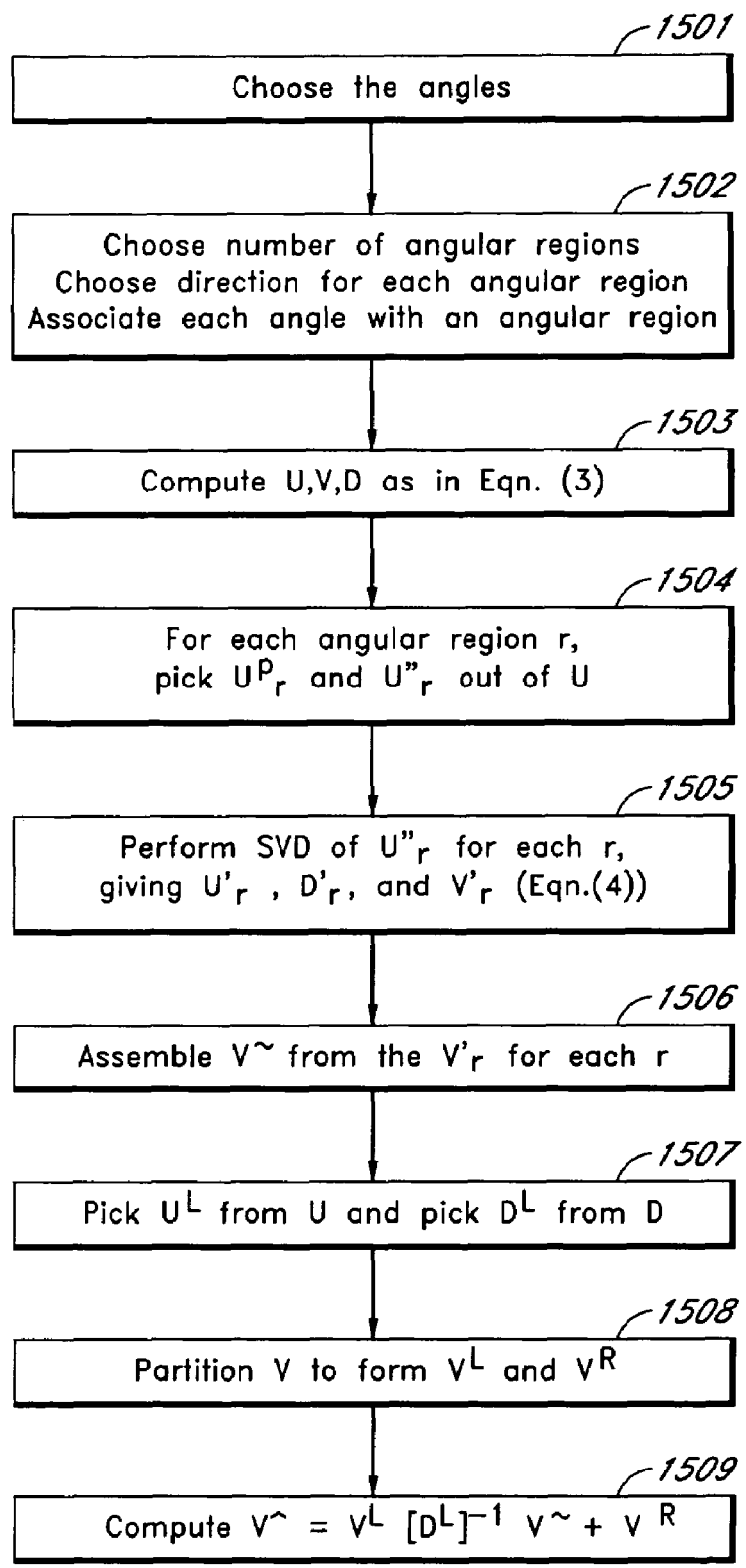
FIG. 15 is flowchart of the steps for transforming sources into non-propagating modes, directional propagating modes, and possibly also other propagating modes.

FIG. 10 gives a flow chart for an embodiment using NEC2. On that flow chart, 1005 is a step labeled "Compute composite sources and testers." In that step, these composite sources and testers are computed for every region. The improvement to the Basic Method described here modifies how they are computed. In FIG. 10, the composite sources for a region are defined by a square matrix V found from an SVD. In FIG. 10, the composite testers for a region are found from a matrix $V^h$. In FIG. 10, each of these matrices is constructed for each region. Each such matrix forms a diagonal block in the diagonal matrix shown in FIG. 7. FIG. 15 is a flow chart for computing a matrix $V^\wedge$ which replaces V. That is, $V^\wedge$ is used in place of V for a block of the block diagonal matrix shown in FIG. 7.

The first step shown in FIG. 15 is 1501, "Choose the angles." In the present example, 1922 angles are chosen. The number 1922 is chosen by way of example only, as any number of angles can be used. This step is generally the same as in the Basic Method (provided that the "angles of interest" can be chosen differently, if desired). In step 1502 the number of angular regions to be used is chosen, and a region direction is chosen for each such angular region. Then, each angle is associated with an angular region. Step 1503 proceeds as in the Basic Method, to compute D, V, and U. This is the same as before, except that now U is also computed. Previously, U occurred in equation (3) but it is typically not needed in the Basic Method. Thus, in the Basic Method, it is acceptable to omit computing it. At this point, in contrast with the Basic Method, the process continues after computing V. It is necessary to compute $V^\wedge$ so the process continues to step 1504. There, for each angular region r, the matrices $U^p{}_r$ and $U''_r$ are projected out of U. The way this is done is described earlier, and it is schematically shown in FIG. 14.

For each angular region r, $U_r''$ can be used to find modes which produce an effect primarily in angular region r, and very little effect elsewhere. The larger matrix U from Eqn. (3) is a unitary matrix. That means that if a Singular Value Decomposition (SVD) is performed on U, all of the singular values would be exactly one. Since $U''_r$ is made up of some truncated rows of U, all of its singular values must be smaller than or equal to one. The SVD of $U''_r$ is computed according to the equation $$U''_r = U_r' D_r' V_r'^h \quad (4)$$

Figure 16:
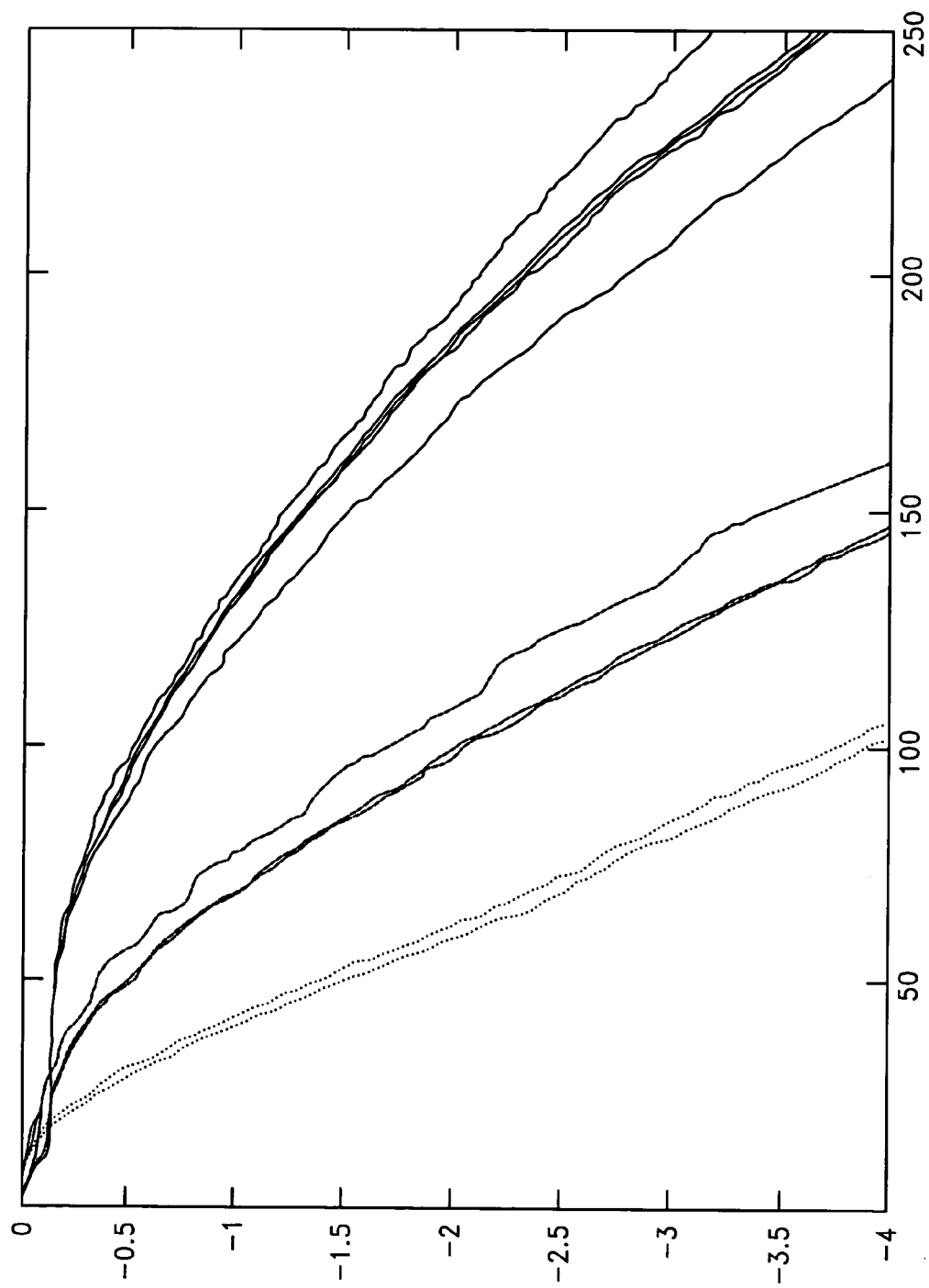
FIG. 16 shows the base ten logarithm of the relative size of the singular values for each angular region, showing four orders of magnitude in the singular values and the first two hundred fifty singular values.
Figure 17:
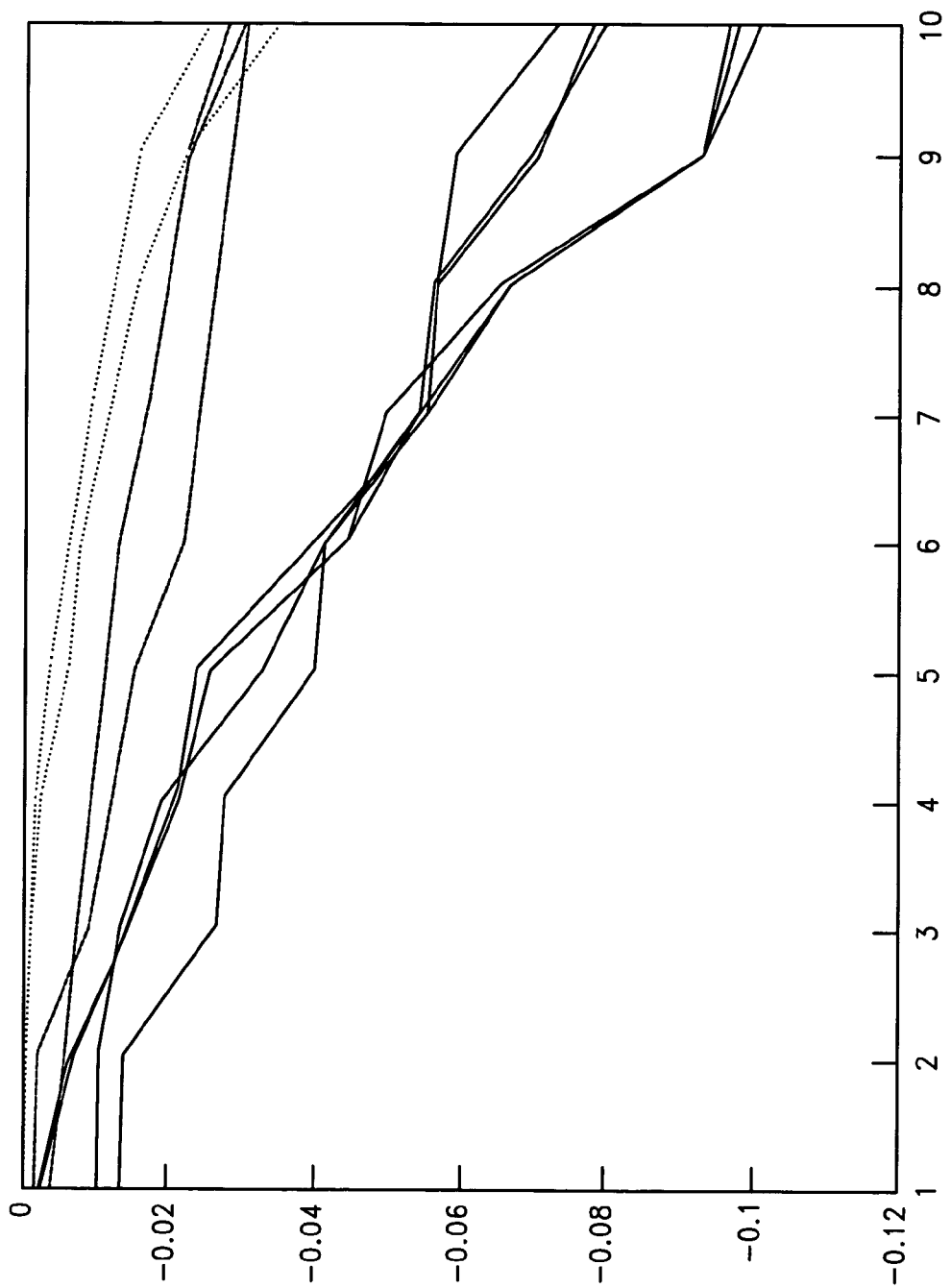
FIG. 17 shows an expanded view of the upper-left portion of FIG. 16 as the base ten logarithm of the relative size of the singular values for each angular region, showing twelve hundredths of an order of magnitude in the singular values and the first ten singular values.

This is done for every angular region r, as shown in 1505. The matrix $V_r'$ has Nps rows and Nps columns, since this is the number of columns in $U''_r$. For modes which do cause an effect primarily in angular range r, the singular value for that mode is nearly as large as one. FIG. 16 plots the first 250 singular values for all fifteen angular regions (one curve for each angular region r) for the sources. The vertical axis gives the base ten logarithm of the singular value. Thus, −4 means a ten thousandth (0.0001), −2 means a hundredth (0.01), and 0 means a singular value of one. FIG. 17 gives an expanded view of the upper left portion of FIG. 16. For example, a value of −0.01 on the vertical axis in FIG. 17 indicates a singular value of size approximately 0.98. It is clear from these figures that for some values of r (i.e. for some angular regions) there are five or more singular values greater than 0.99. For all values of r there are at least five singular values greater than 0.9. The large singular values (e.g., singular values close to one) indicate that nearly all of the effect of the associated sources is in one angular region.

Figure 18:
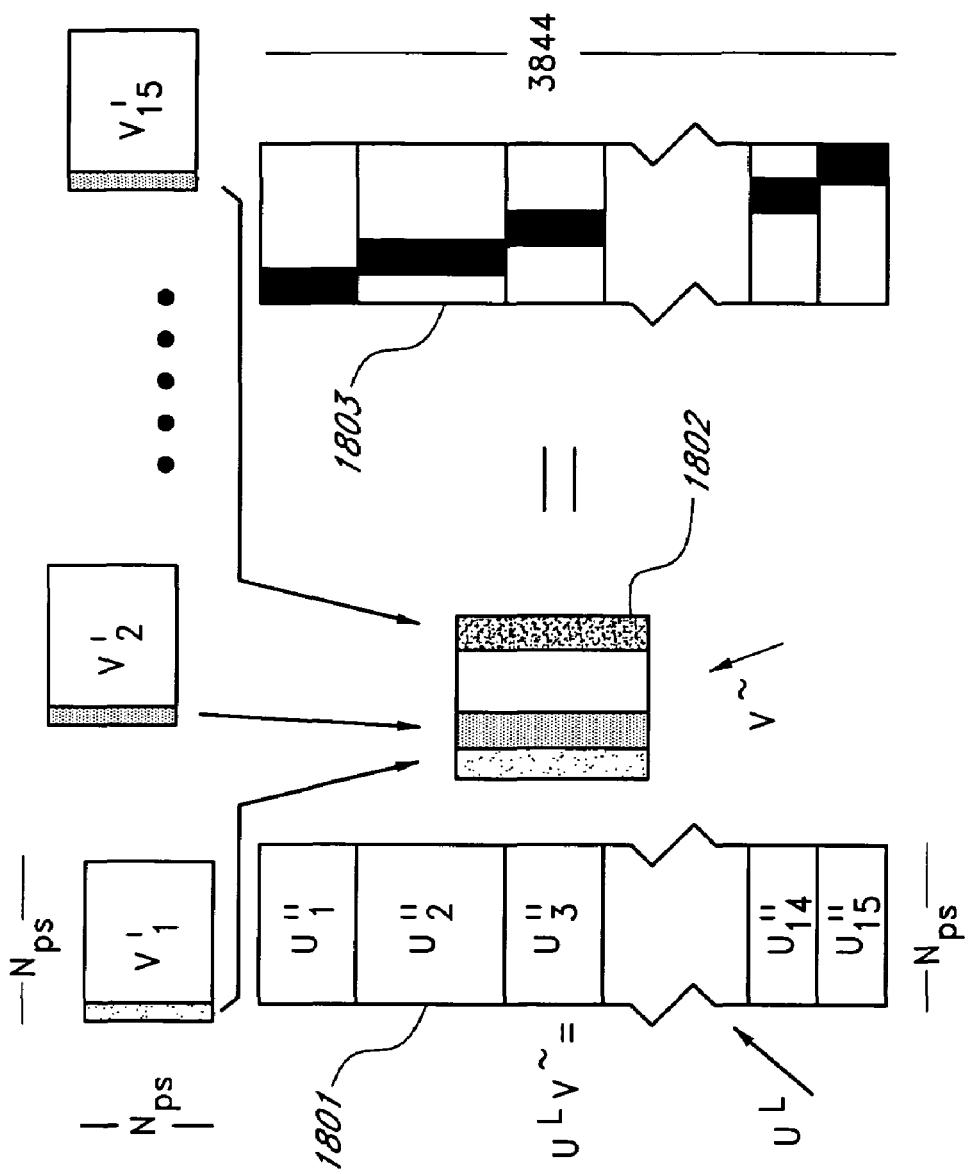
FIG. 18 shows how $V^~$ is assembled from the $V'_r$ and the matrix product of the leftmost part of U with $V^~$.

For each value of r, (i.e. for r=1 to r=15) it is possible to choose the first five columns of $V_r'$ and to assemble a matrix from these fifteen groups of five columns. This matrix is called $V^\sim$. For example, the thirteenth column of $V^\sim$ is the same as the third column of $V_3'$. FIG. 18 shows $V^\sim$ 1802 and how it is assembled. It shows that each of the matrices $V_r'$ has Nps rows and Nps columns. The matrix $V^\sim$ 1802 will also have Nps rows, but it will have 5 times 15 or 75 columns, see FIG. 18. Computing $V^\sim$ is step 1506 in FIG. 15.

Each row of the matrix U is associated with an angle, and thus with an angular region. These rows can be reordered so that all of the rows associated with the first angular region occur first, those associated with the second angular region occur second, etc. Then, the resulting matrix can be partitioned into a left part composed of the first Nps columns, and a right part composed of the remaining columns. These parts are called $U^L$ and $U^R$ for the left and right parts of the matrix U after its rows are reordered. The matrix $U^L$ can equivalently be defined as the collection of the matrices $U''_r$ concatenated together (each successive one below the preceding one). The matrix $U^L$ is shown 1801 in FIG. 18. The matrix $V^\sim$ has been constructed with the motivation that it is desired that the product $U^L V^\sim$ have a special structure. The structure of this matrix product is shown schematically 1803 in FIG. 18, where the shaded area indicates matrix elements that are large. In these shaded areas, the norm of any column is approximately equal to one. The other areas have very small matrix elements. They are small because nearly all of the "energy" or other relevant effect has been transmitted to the desired angular region, and only a small amount is left over. The corresponding singular values shown in FIGS. 16 and 17 are nearly one, confirming this.

Eqn. (3) is equivalent to the equation $$A V = U D \quad (5)$$

In the description of the Basic Method, it is observed that the singular values going down the diagonal of D decrease in size and as a result the successive columns of the matrix product on either side of the equal sign in Eqn. (5) also decrease in size. As a result, the columns on the right part of either matrix product in Eqn. (5) are small. The columns on the left part of the product A V and of U D cannot be small. This embodiment of this invention involves using $V^\sim$ to create a new matrix $V^\wedge$. The product $A V^\wedge$ will have more small values than the product A V. In this embodiment, using the matrix $V^\wedge$ rather than V can increase the amount of data compression.

The top left portion of D, of size Nps rows and Nps columns, gives a new matrix which is called $D^L$. The matrix $D^L$ is different than the matrix $D_r'$, even though both matrices have the same number of columns. Taking the left portion of the matrix product on the right hand side of the equal sign in Eqn. (5), and reordering rows as before, gives $U^L D^L$. This important quantity is related to $U^L V^\sim$ by:

$$U^L D^L [D^L]^{-1} V^\sim = U^L V^\sim \quad (6)$$

As illustrated in FIG. 18, the product $U^L V^\sim$ has relatively many relatively small entries. This shows that if the rows are reordered on either side of Eqn. (5) and the left most portion of this is taken, and if furthermore the result of this is multiplied by $[D^L]^{-1} V^\sim$, then a sparse matrix results. This sparse matrix is shown 1803 in FIG. 18.

To restate, let the matrix V have a left part of Nps columns and a right part composed of the remaining columns of V. Call these parts $V^L$ and $V^R$ respectively. Schematically, one could write $V^L + V^R = V$. Here the + stands for concatenating the matrices together, one to the right of the other. It does not stand for matrix addition. Consider the matrix:

$$A \{V^L [D^L]^{-1} V^\sim + V^R\} \quad (7)$$

This matrix will generally be sparse. The right portion is sparse because it is identical to the small elements as produced by the Basic Method. The left portion is sparse because, except for a reordering of rows, it has been constructed to be the same as $U^L V^\sim$. The matrix product $U^L V^\sim$ is shown 1803 in FIG. 18. In the Basic Method, the matrix A is multiplied by V. For this embodiment of this invention, A is multiplied by a new matrix $V^\wedge$. The matrix $V^\wedge$ is found from V, according to the formula:

$$V^\wedge = V^L [D^L]^{-1} V^\sim + V^R \quad (8)$$

As before, the pluses above in Eqn. (7) and Eqn. (8) represent concatenation of the left and right parts of the matrix. These plus signs do not represent matrix addition.

The matrix product $A V^\wedge$ is constructed to be sparse. In this embodiment, $V^\wedge$ is constructed so that the matrix product $A V^\wedge$ is typically even more sparse than A V. Both V and $V^\wedge$ can be used as a linear transformation which produces composite sources from the sources. These composite sources can be used to compress interaction data. Let $Z_b$ be a block of the matrix of interaction data. Furthermore, assume that the columns of $Z_b$ correspond to the sources in the source region used in computing V and $V^\wedge$. In one embodiment of the Basic Method, not only is A V sparse, but the product $Z_b V$ is sparse also. That is, V is constructed using the data in A, yet it provides a way to compress the data in $Z_b$.

In one embodiment, $A V^\wedge$ is constructed so that it is sparse, typically, even more sparse than A V. In addition, the matrix $Z_b V^\wedge$ is typically even more sparse than $Z_b V$. This surprising result occurs because $V^\wedge$ creates directional propagating modes. Furthermore, the strength of the effect due to a directional propagating mode varies relatively smoothly with angular direction. Directional propagating modes are constructed in a way that tends to build-in smoothness. This results in the strength of the effect being small not just at the directions specified by A. It is also small between these directions. Generally, the effect will also be small for many of the directions of interest in the data contained in $Z_b$. Also, A is constructed so as to use the long distance form of the effect. For the parts of $Z_b$ which involve somewhat long distances, significant compression typically results.

A similar computation can also be done with the testers. This is generally desirable, since it generally further increases the sparseness. In the Basic Method, an embodiment is disclosed using NEC2, where to find the composite testers for one region an SVD is performed on a matrix $A^*$. This gives matrices U and V, just as for sources. Then, $V^h$ is used as one block of the block diagonal matrix shown in FIG. 7. The superscript h indicates Hermitian conjugate. For computing the testers for directional modes, U and V are found as before. Then $V^\wedge$ is found using the formula in Eqn. (8). Then, $V^{\wedge h}$ is used as a block of the block diagonal matrix instead of using V as that block as is done in the Basic Method.

The process of finding the matrix $V^\wedge$ for either sources or testers can be modified to use an optional extra step. Once $V^\sim$ is found, it can be modified before it is used. It can be modified so that its columns are orthogonal. Well-known mathematical techniques such as Gram-Schmidt Orthogonalization can be used. Generally, these techniques require that the columns be chosen in some specific order. As each next column is chosen, it is replaced by a new column vector that is orthogonal to all of the previously chosen columns. Each new column vector can, for example, be placed in the same location within $V^\sim$ as the column it replaces.

In one embodiment, calculations are performed using this optional extra step. The columns are chosen in the order of their singular vector, starting with the largest. That is, $D_r'$ from equation (4) is searched for r=1 to r=15 for the largest singular value. The associated column of $V^\sim$ is chosen as the first column. Then, the next largest singular value in $D_r'$ for r=1 to 15 is found. The associated column of $V^\sim$ is chosen as the next column for orthogonalization, and so on. For many problems, orthogonalization of the columns of $V^\sim$ results in significantly less data compression. Fortunately, the columns of V~ often tend towards being somewhat close to orthogonal, even when this step is omitted. The construction of V~ tends to make it a well-conditioned matrix. Thus, for many applications there is no strong reason to include this orthogonalization step.

Figure 19:
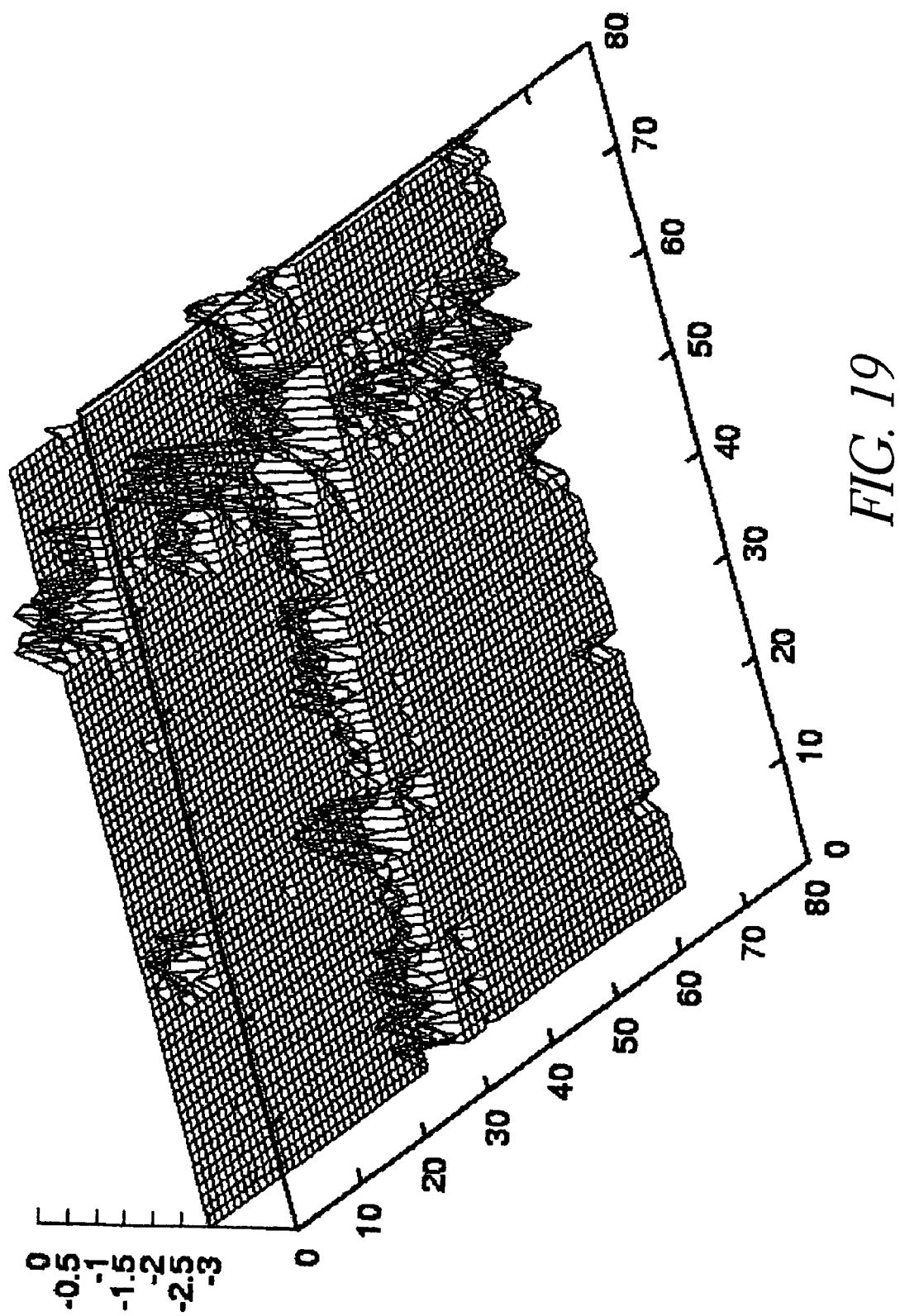
FIG. 19 shows a three-dimensional plot of the base ten logarithm of the magnitudes of the matrix elements for the upper left corner, of size 75 by 75, of the block of interaction data of size 1922 by 1922, using directional propagating modes. Three orders of magnitude in the size of matrix elements are shown.
Figure 20:
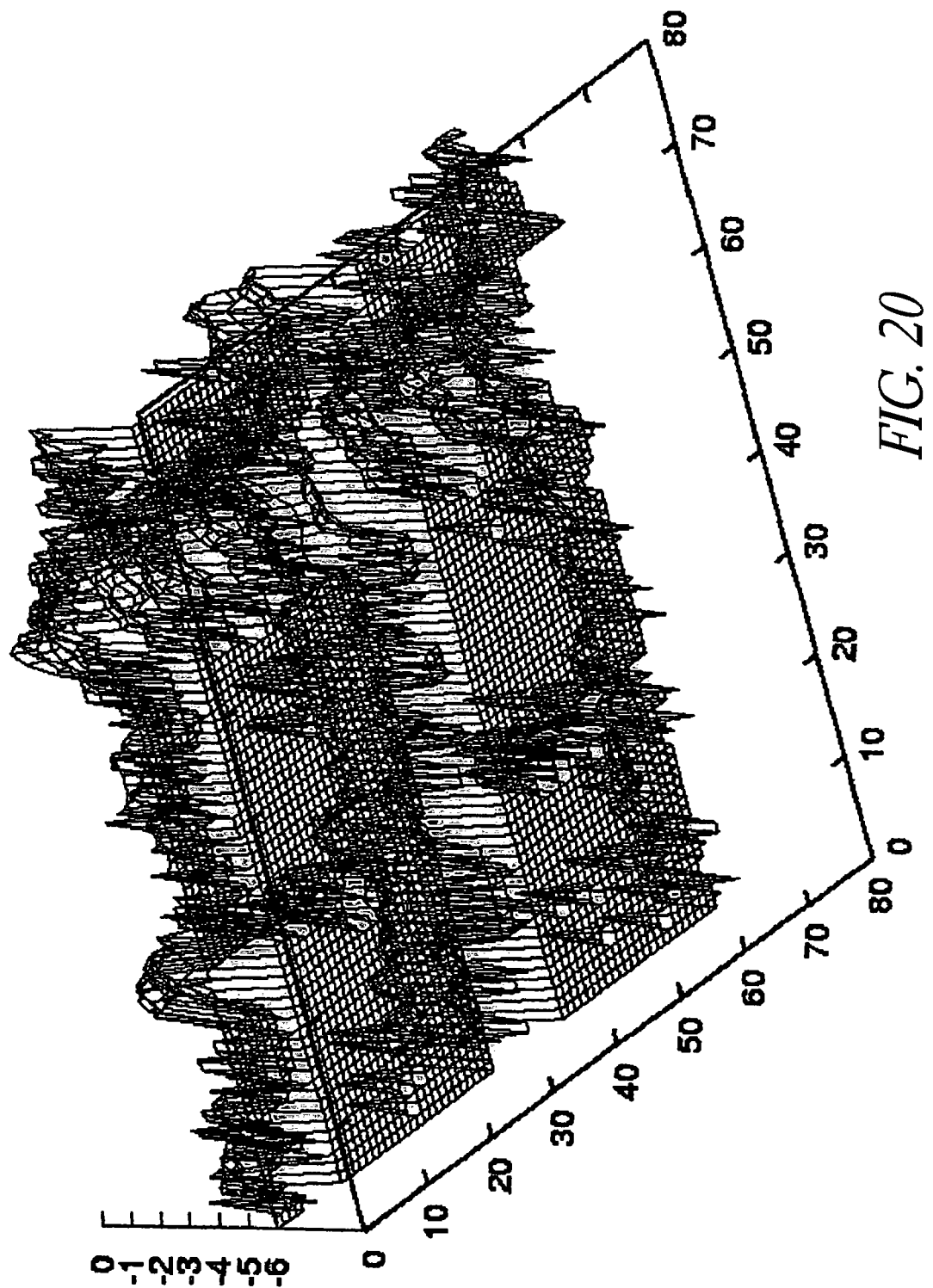
FIG. 20 shows a three-dimensional plot of the base ten logarithm of the magnitudes of the matrix elements for the upper left corner, of size 75 by 75, of the block of interaction data of size 1922 by 1922, using directional propagating modes, where six orders of magnitude in the size of matrix elements are shown, instead of three orders of magnitude as on FIG. 19.

Transforming propagating sources and testers to include directional propagating sources and testers generally produces additional data compression. An example of this has been computed for the physical example of FIG. 13 and the embodiment just described. The results of this computation are shown in FIGS. 19 and 20. The compression achieved there is for computations without the extra orthogonalization step. In these figures, the vertical axis plots the base ten logarithm of the magnitude of the matrix elements. This is normalized to the largest matrix element within that figure. FIGS. 19 and 20 both plot the same data. FIG. 19 shows a range of three orders of magnitude (a factor of one thousand) in matrix element size. FIG. 20 shows six orders of magnitude (a factor of one million) in matrix element size.

The example of the physical problem illustrated in FIG. 13 concerns the interaction between the regions 1301 and 1302. The computer program NEC2 is used to describe this interaction as a matrix with 1922 rows and 1922 columns. An embodiment of the Basic Method is used to transform the sources and testers to produce composite sources and testers. These composite sources and testers compose propagating modes and non-propagating modes. This transformation compresses most of the matrix of interaction data. This matrix is of dimension 1922 by 1922. The top left corner of this matrix still has large elements. A block of size 75 by 75 of the top left corner can be further transformed to use directional propagation modes. This is accomplished by replacing the V for sources by V^ for sources and by replacing the V for testers by the V^ for testers. It is this block of size 75 by 75 that is plotted in FIGS. 19 and 20.

FIG. 19 shows a group of large matrix elements near row 38 and column 63. This part of the matrix is associated with an angular region for the sources and with an angular region for the testers. These particular columns use directional sources, which transmit beams in the angular region that is directed towards the testing region. In addition, these particular rows use testers that receive strongly from the angular region which is directed from the source region.

FIG. 20 shows that much of the data has been reduced in magnitude by more than a factor of a million. This data is for two regions that are physically separated by a significant distance. Often, other parts of a problem being computed involve a source and a tester which are close together. That interaction is often a hundred times stronger, or even more, than data for a separated source and tester. Thus, often the small numbers here are smaller by more than a factor of one hundred million (or ten to the eighth power) than the largest numbers being used in a computation. Numbers such as this are indistinguishable from zero when single precision accuracy is used. That is, single precision computations on many computers have just over seven digits of accuracy. In such computations, small numbers are rounded off to zero due solely to the accuracy a computer provides. Thus, the many small matrix elements shown in FIGS. 19 and 20 can often be rounded off to zero, giving significant data compression. In many cases even less accuracy than this is needed. For many computer programs in use today, including those that do not use data compression, the interaction data is often only computed to four digits of accuracy. This is especially common when this data is computed by performing integrals according to some numerical approximation. For those problems, a weaker tolerance can be used resulting in even more of the interaction data being approximated by zero after the transformation to directional propagating modes.

When V is replaced by V^, many modes are transformed into directional propagating modes. In this example, the first 75 columns of V^ are different from those columns of V. This transforms 75 modes into directional propagating modes. In this example, V would generally be considered to have had more than 75 propagating modes. Those other propagating modes in addition to these 75 were not transformed. Alternatively, more than these 75 modes might have been transformed. This can have included some number of non-propagating modes. In many (but not all) cases, that number of non-propagating modes transformed would be relatively small. The number of modes which are transformed into directional propagating modes can vary from problem to problem according to a variety of considerations.

The specific example given above illustrates many features of the general method. One particular step that can be performed in different ways involves the matrix product A V. The rows of this matrix product can be reordered so that the rows associated with the first angular region occur first, those associated with the second occurred second, and so on. Then, any method can be used which replaces V by a new matrix so that the matrix product then takes on substantially the form shown as 1803 in FIG. 18. Even the reordering of rows and the form shown as 1803 is not necessary. It is desirable that the matrix product is generally sparse. It also is generally desirable that the columns of V which are to be directional propagating modes contain primarily strongly propagating modes.

In the general case, if V is replaced by a new matrix V^, the term directional propagating modes needs to be defined. A definition is needed which is still valid when the rows of A are not reordered as above. Choose any column of the product A V^. If this column has relatively many zero or near zero elements, and it also has some but a relatively small number of large elements, then this same column of V^ can represent a directional propagating mode. If in addition this same column of V^ represents a mode which gives a pattern of radiation which is smooth with respect to changes in the angular direction, then it does indeed represent a directional propagating mode.

One way (out of many possibilities) to ensure that the directional propagating modes contain primarily strongly propagating modes is to construct them as a linear combination of strongly propagating modes. Ensuring that the directional propagating modes contain primarily strongly propagating modes promotes smoothness in the radiation pattern. The embodiment described above uses this approach. That embodiment used a linear combination based on only the left most columns of V. A relatively small number of the other columns of V can be used. As an example, an optimization technique (e.g., least squares, constraint theory, etc.) can be used to limit the total number of these other columns of V, and the directional properties can be optimized subject to this constraint. As another example, one can pick a number of columns near the left side of V to use in a linear combination.

Embodiments described above use the fact that A V is equal to U D. The matrix U is unitary, so it is convenient to work with it. These unitary properties are used to find a matrix V so that the matrix product of the left part of U with V~, $U^L V~$, is sparse. In fact, after the appropriate reordering of rows, the approximate block diagonal form illustrated in FIG. 18 as 1803 resulted. Elementary matrix algebra then allowed this to be converted into a result about A. This can be accomplished using the matrix A directly instead.

In general, a matrix $V^\wedge$ is found, where some of the columns of $V^\wedge$ represent directional propagating modes. As a result, if $V^D$ represents the columns of V for directional propagating modes, then the matrix product $A\,V^D$ is sparse. Let $Z_b$ be a block of interaction data, which is associated with sources in one physical region producing an effect in a different (testing) physical region. Let $V^D$ contain directional propagating modes for this source region. Let $v_c$ be the column of $V^D$ for one directional propagating mode. This directional propagating mode produces a weak effect over some range of directions. If the direction from the source region to the testing region is within this range of directions, then typically the effect within the testing region is weak and the product $Z_b v_c$ is small. In many cases it can be approximated by zero. Since $v_c$ is a typical column of $V^D$, much of the product $Z_b\,V^D$ will also be small and much of it can often be approximated by zero. This typically provides a significant amount of data compression. This data compression is in addition to any achieved by the use of non-propagating modes. Also, this same method can be used to produce directional propagating modes within testers, which increases the data compression even further.

An embodiment described above showed a way to partition 1922 angular directions into 15 region directions. These 15 region directions were a partition of all directions of interest. That is, these region directions were both non-overlapping and together they included all directions of interest. Often this is desirable since it tends to produce composite modes that are also non-overlapping. Ideally (for some applications) they can be orthogonal or nearly so. For other applications, the region directions can be overlapping. They can be overlapping for the production of non-propagating and strongly propagating modes as in the Basic Method. Independently of that choice, they can be overlapping. Typically, overlapping directions results in an over-complete set of composite modes. There are known methods for using such over-complete sets of modes, such as by using "frames" (the word "frames" often occurs in the context of wavelets).

A general form of a method to produce directional propagating modes includes (an analogous method can be used to produce directional propagating testers):

i) Choose ranges of directions.

ii) For each range of directions, Construct new sources that contain primarily strongly propagating modes and relatively less non-propagating modes and which give a strong effect over this range of directions. These new sources are directional propagating modes.

As an example, a strong effect can be achieved by using an optimization procedure to optimize the strength of their effect over a given range of directions. This optimization can be subject to some constraints, such as the amount of non-propagating modes that can be used.

The algorithms in the above disclosure can be implemented in software and loaded into a computer memory attached to a computer processor to calculate, for example, propagation of energy, pressure, vibration, electric fields, magnetic fields, strong nuclear forces, weak nuclear forces, etc. Similarly, the algorithms can be implemented in software and loaded into a computer memory attached to a computer processor to calculate, for example, electromagnetic radiation by an antenna, electromagnetic scattering, antenna properties, etc.

Although the foregoing has been a description and illustration of specific embodiments of the invention, various modifications and changes can be made thereto by persons skilled in the art without departing from the scope and spirit of the invention. For example, in addition to electromagnetic fields, the techniques described above can also be used to compress interaction data for physical disturbances involving a heat flux, an electric field, a magnetic field, a vector potential, a pressure field, a sound wave, a particle flux, a weak nuclear force, a strong nuclear force, a gravity force, etc. The techniques described above can also be used for lattice gauge calculations, economic forecasting, state space reconstruction, and image processing (e.g., image formation for synthetic aperture radar, medical, or sonar images). Accordingly, the invention is limited only by the claims that follow.

What is claimed is:

1. A method of computing interactions produced by at least one directional composite source and described by a first system of linear equations comprising:

using a computer processor and a computer program stored in a computer-readable medium calculating at least one directional composite source, wherein said at least one directional composite source represents at least one of an electrical current, a distribution of electric charge, an exciting pressure, and an exciting particle flux and wherein said first system of linear equations models at least one of an electric field, a magnetic field, a pressure, and a particle flux that is produced by said at least one directional composite source;

calculating at least one directional composite tester from more than one testers wherein an optimization procedure is used to cause said at least one directional composite tester to strongly receive disturbances from a physically-achievable first portion of space relative to said at least one directional composite tester and said at least one directional composite tester is affected relatively weakly by energy propagating from a second portion of space relative to said at least one directional composite tester;

transforming at least a portion of said first system of linear equations into a second system of linear equations based at least in part on said at least one directional composite source and said at least one directional composite tester; and using said second system of linear equations computing and storing interactions between said at least one directional composite source and said at least one directional composite tester.

2. The method of claim 1, wherein said second system of linear equations is represented by a block sparse matrix.

3. The method of claim 1 wherein said at least one directional composite source represents a distribution of electric charge.

4. The method of claim 1, wherein said optimization procedure uses a moment method matrix.

5. The method of claim 1, wherein said optimization procedure uses a matrix of disturbances.

6. The method of claim 1, wherein at least a portion of said first portion of space relative to said at least one directional composite tester is a far-field region.

7. The method of claim 1, wherein at least a portion of said second portion of space relative to said at least one directional composite tester is a far-field region.

8. The method of claim 1, wherein said at least one directional composite source comprises acoustic sources.

9. The method of claim 1, wherein said at least one directional composite source comprises electromagnetic sources.

10. The method of claim 1, wherein said at least one directional composite source comprises thermal sources.

11. The method of claim 1, wherein said at least one directional composite source corresponds to a region.

12. The method of claim 1, wherein said second system of linear equations is described by a sparse block-diagonal matrix.

13. The method of claim 12, further comprising the step of reordering said sparse block diagonal matrix to shift relatively larger entries in said matrix towards a desired corner of said matrix.

14. A method using a computer processor and a computer-readable medium encoded with a computer program for constructing directionally-propagating modes that describe sources that produces a weak effect in a portion of space to compute effects described by an interaction matrix, comprising:
storing said interaction matrix in said computer-readable medium, wherein said interaction matrix models at least one of an electric field, a magnetic field, a pressure, and a particle flux that is produced by first modes and wherein each first mode describes a source, said source comprising at least one of a distribution of electric charge, an electric current, an exciting pressure, and an exciting particle flux transforming first modes into second modes wherein said second modes are relatively more strongly propagating than said first modes;
choosing an angular region;
using an optimization procedure and said second modes to construct directionally-propagating modes that interact relatively strongly within said angular region and relatively weakly outside said angular region by said computer processor; and
transforming said interaction matrix into a sparse interaction matrix corresponding to said directionally-propagating modes and
using said sparse interaction matrix to compute and store effects, due at least in part, to said first modes.

15. The method of claim 14, wherein said first modes are composite modes.

16. The method of claim 14 wherein a plurality of said first modes describe sources involving electric charges.

17. The method of claim 14 wherein said using said sparse interaction matrix comprises finding the strength of an electric field.

18. A method using a computer processor and a computer-readable medium encoded with a computer program for producing directional modes to compute interactions, comprising:
identifying directions of interest represented by an interaction matrix;
storing said interaction matrix in said computer-readable medium, wherein said interaction matrix models at least one of an electric field, a magnetic field, a pressure, and a particle flux that is produced by modes and wherein each mode describes a source, said source comprising at least one of a distribution of electric charge, an electric current, an exciting pressure, and an exciting particle flux;
choosing a collection of physically-achievable angular regions comprising said directions of interest;
constructing, for each angular region, one or more directional modes as a linear combination of more than one of said modes by using an optimization procedure, where said directional modes propagate relatively strongly;
using said directional modes to compress data in said interaction matrix: storing said compressed interaction matrix efficiently in said computer-readable medium; and
using said compressed interaction matrix to compute interactions between said at least one of an electric field, a magnetic field, a pressure, and a particle flux and said modes.

19. The method of claim 18, wherein said interaction matrix describes interactions of wave phenomena.

20. The method of claim 18, wherein said interaction matrix describes interactions of electromagnetic phenomena.

21. The method of claim 18, wherein said interaction matrix describes interactions of acoustic.

* * * * *